US009329239B2

(12) United States Patent
Kunimitsu et al.

(10) Patent No.: US 9,329,239 B2
(45) Date of Patent: May 3, 2016

(54) BATTERY SYSTEM, ELECTRIC-POWERED VEHICLE, MOVABLE EQUIPMENT, POWER STORAGE DEVICE, AND POWER SOURCE APPARATUS

(75) Inventors: Tomonori Kunimitsu, Hyogo (JP); Kazumi Ohkura, Nara (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 350 days.

(21) Appl. No.: 14/007,208

(22) PCT Filed: Jan. 26, 2012

(86) PCT No.: PCT/JP2012/000493
§ 371 (c)(1),
(2), (4) Date: Sep. 24, 2013

(87) PCT Pub. No.: WO2012/132178
PCT Pub. Date: Oct. 4, 2012

(65) Prior Publication Data
US 2014/0015454 A1 Jan. 16, 2014

(30) Foreign Application Priority Data
Mar. 28, 2011 (JP) ................................. 2011-070100

(51) Int. Cl.
*G01R 31/36* (2006.01)
*H02J 7/00* (2006.01)
*H01M 10/42* (2006.01)
*H01M 10/48* (2006.01)
*B60L 3/00* (2006.01)
*B60L 11/18* (2006.01)

(52) U.S. Cl.
CPC ........... *G01R 31/3606* (2013.01); *B60L 3/0046* (2013.01); *B60L 11/18* (2013.01); *H01M10/4257* (2013.01); *H01M 10/482* (2013.01); *H02J 7/007* (2013.01); *H02J 7/0021* (2013.01); *H01M 2010/4278* (2013.01); *H02J 2007/004* (2013.01); *H02J 2007/0037* (2013.01); *Y02T 10/7055* (2013.01)

(58) Field of Classification Search
CPC ...... G01R 31/36; H02J 7/00; H01M 10/4257; H01M 10/482
USPC ........................... 318/139; 320/134, 128, 127
See application file for complete search history.

(56) References Cited

U.S. PATENT DOCUMENTS

| | | | |
|---|---|---|---|
| 2009/0130541 A1* | 5/2009 | Emori | H02J 7/0019 429/61 |
| 2009/0198399 A1* | 8/2009 | Kubo | B60L 11/1855 701/22 |
| 2010/0001737 A1 | 1/2010 | Kubo et al. | |

FOREIGN PATENT DOCUMENTS

| | | |
|---|---|---|
| JP | 2002-272009 | 9/2002 |
| JP | 2003-79059 | 3/2003 |
| JP | 2005-328684 | 11/2005 |
| JP | 2010-16928 | 1/2010 |
| WO | 2011/132434 | 10/2011 |

OTHER PUBLICATIONS

International Search Report issued May 1, 2012 in International Application No. PCT/JP2012/000493.

* cited by examiner

*Primary Examiner* — Kawing Chan
(74) *Attorney, Agent, or Firm* — Wenderoth, Lind & Ponack, L.L.P.

(57) ABSTRACT

The signal output circuit of the highest rank state detection section outputs an abnormal signal that is generated by the processing device when an abnormality is detected by the abnormality detection section. When no abnormality is detected, a normal signal is generated by the processing device and output as the detection signal. In each state detection section other than that of the highest rank, the signal output circuit outputs an abnormal signal generated by the processing device when an abnormality is detected by the abnormality detection section, and outputs the detection signal input from a higher rank state detection section when no abnormality is detected.

17 Claims, 14 Drawing Sheets

BATTERY SYSTEM, ELECTRIC-POWERED VEHICLE, MOVABLE EQUIPMENT, POWER STORAGE DEVICE, AND POWER SOURCE APPARATUS

BACKGROUND OF THE INVENTION

1. Field of the Invention

The present invention relates to a battery system and to an electric-powered vehicle, movable equipment, power storage device, and power source apparatus equipped with that battery system.

2. Description of the Related Art

A battery system used for the driving power in movable equipment such as an electric automobile (electric car, electric vehicle, EV) is provided with a plurality of battery modules that can be charged and discharged. Each battery module is configured with a plurality of batteries (battery cells) that are, for example, connected in series. Further, the battery system is provided with detection devices that detect abnormalities such as battery cell over-charging and over-discharging.

In the vehicle battery array control apparatus cited in Japanese Laid-Open Patent Publication 2003-79059, a plurality of unit cell over-charging and over-discharging detection devices are provided corresponding to a plurality of cell groups that make up the battery array. Each unit cell over-charging and over-discharging detection device determines whether or not over-charging or over-discharging has occurred in the battery cells of the corresponding cell group, and transmits the results to the battery controller.

In the vehicle battery array control apparatus cited in Japanese Patent Publication 2003-79059, battery cell over-charging or over-discharging in a cell group is detected by the battery controller. However, when the number of cell groups in the battery array increases, communication circuitry between the unit cell over-charging and over-discharging detection devices and the battery controller becomes complex.

Accordingly, there is demand for a system that can transmit abnormality detection results for a plurality of battery cells to the outside without complicated circuitry. In addition, rapid transmission of the battery cell abnormality detection results to the outside is also sought.

It is an object of the present invention to provide a battery system that can rapidly transmit abnormality detection results for a group of battery cells to the outside without making the communication circuitry complex, and to provide an electric-powered vehicle, movable equipment, power storage device, and power source apparatus equipped with the battery system.

SUMMARY OF THE INVENTION (1) A battery system for the first aspect of the present invention is provided with a plurality of battery modules. Each battery module includes a group of battery cells made up of one or a plurality of battery cells and a state detection section to detect the state of the corresponding group of battery cells. Each state detection section includes an abnormality detection section to detect abnormalities in the corresponding group of battery cells, an abnormal signal generating section to issue abnormal signals indicating an abnormality in the corresponding group of battery cells, and a signal output circuit that can output abnormal signals issued by the abnormal signal generating section. The plurality of battery module state detection sections are configured with a signal transmission ranking from highest to lowest rank. The signal output circuit of the highest rank state detection section outputs the abnormal signal issued from the corresponding abnormal signal generating section when an abnormality is detected by the corresponding abnormality detection section. The signal output circuit of each state detection section other than the highest rank state detection section outputs the abnormal signal issued from the corresponding abnormal signal generating section when an abnormality is detected by the corresponding abnormality detection section, and outputs the abnormal signal issued from a higher rank state detection section when no abnormal condition is detected by the corresponding abnormality detection section.

In this battery system, the state detection sections of the plurality of battery modules have a signal transmission ranking from highest to lowest. The signal output circuit of the highest rank state detection section outputs the abnormal signal issued by the associated abnormal signal generating section when an abnormality is detected by the associated abnormality detection section. The signal output circuit of each state detection section other than that of the highest rank outputs the abnormal signal issued by the associated abnormal signal generating section when an abnormality is detected by the associated abnormality detection section, and outputs the abnormal signal output from a higher rank state detection section when no abnormality is detected by the associated abnormality detection section.

Regardless of whether or not an abnormal signal is transmitted from the signal output circuit of a higher rank state detection section, the signal output circuit of each state detection section outputs an abnormal signal when an abnormality is detected by the associated abnormality detection section. This allows battery cell group abnormality to be detected quickly.

Further, for abnormality detection sections that have detected an abnormality, the abnormal signal corresponding to the lowest rank abnormality detection section is output from the lowest rank signal output circuit. Accordingly, there is no need to transmit the abnormality detection section results of a plurality of state detection sections to the outside over independent communication circuits.

Consequently, detection results for a plurality of abnormality detection sections can be rapidly transmitted to the outside without making the communication circuitry complex.

(2) Each state detection section can also include parameter detection sections to detect parameters indicating the state of one or a plurality of battery cells in the corresponding group of battery cells, and a communication circuit to transmit parameters detected by the parameter detection sections to the outside.

In each state detection section, parameters detected by the parameter detection sections indicating the state of one or a plurality of battery cells in the battery cell group are transmitted to the outside by the communication circuit. Consequently, abnormalities in the parameters, which indicate the state of one or a plurality of battery cells, can be detected. As a result, battery system reliability is improved.

(3) Each state detection section other than the highest rank state detection section can also include a selection signal generating section that generates a selection signal to select either the abnormal signal output from a higher rank state detection section or an abnormal signal generated by the abnormal signal generating section based on whether or not an abnormality is detected by the corresponding abnormality detection section. The signal output circuit of each state detection section other than the highest rank state detection section can output the abnormal signal output from a higher rank state detection section or the abnormal signal generated by the corresponding abnormal signal generating section depending on the selection signal generated by the corresponding selection signal generating section.

Here, the selection signal generating section of each state detection section other than that of the highest rank generates a selection signal based on whether or not an abnormality is detected by the corresponding abnormality detection section. Further, the signal output circuit of each state detection section other than that of the highest rank outputs the abnormal signal generated by the corresponding abnormal signal generating section or the abnormal signal output from a higher rank state detection section depending on the selection signal generated by the corresponding selection signal generating section. As a result, the signal output circuit of each state detection section can reliably output an abnormal signal when an abnormality is detected by the corresponding abnormality detection section.

(4) The abnormal signal generating section and communication circuit of each state detection section can be implemented by a processing device. This allows state detection section scale reduction and also simplifies the structure of the state detection section.

(5) The abnormal signal generating section, selection signal generating section, and communication circuit of each state detection section can be implemented by the processing device. This allows state detection section scale reduction and further simplifies the structure of the state detection section.

(6) Each abnormal signal generating section of the plurality of state detection sections can generate a pulse signal with a different duty cycle as its respective abnormal signal.

Accordingly, this allows output from the lowest rank state detection section to be detected, out of all the state detection sections that have detected an abnormality, based on the duty cycle of the lowest rank pulse signal.

(7) The abnormality detection section of each state detection section can operate on power from the corresponding group of battery cells, while the abnormal signal generating section and signal output circuit of each state detection section can operate on power from a power supply other than one or a plurality of battery cells.

This allows the abnormal signal generating section and signal output circuit to operate stably and independently from the abnormality detection section.

(8) An electric-powered vehicle for another aspect of the present invention is provided with the battery system for the first aspect of the present invention, a motor driven by battery system power, and driving wheel(s) rotated by torque from the motor.

In this electric-powered vehicle, the motor is operated by power from the battery system described above, and the driving wheel(s) are rotated by torque from the motor to move the electric-powered vehicle.

Since this electric-powered vehicle uses the battery system described above, abnormality in a group of battery cells can be rapidly detected. In addition, detection results from a plurality of abnormality detection sections can be quickly transmitted to the outside without making the communication circuitry complex.

(9) Movable equipment for still another aspect of the present invention is provided with the battery system for the first aspect of the present invention, a main unit of the movable equipment, and a mechanical power source to convert electric power from the battery system to mechanical motion to move the main unit of the movable equipment.

In this movable equipment, electric power from the battery system described above is converted to mechanical motion by the mechanical power source to move the main unit of the movable equipment.

Since this movable equipment uses the battery system described above, abnormality in a group of battery cells can be rapidly detected. In addition, detection results from a plurality of abnormality detection sections can be quickly transmitted to the outside without making the communication circuitry complex.

(10) A power storage device for still another aspect of the present invention is provided with battery systems for the first aspect of the present invention, and a system control section that performs control related to charging and discharging the plurality of battery modules in the battery systems.

In this power storage device, control related to charging and discharging the plurality of battery modules in the battery systems described above is performed by the system control section. Consequently, over-charging, over-discharging, and degradation can be prevented in the plurality of battery modules.

Since this power storage device uses the battery systems described above, abnormality in a group of battery cells can be rapidly detected. In addition, detection results from a plurality of abnormality detection sections can be quickly transmitted to the outside without making the communication circuitry complex.

(11) A power source apparatus for still another aspect of the present invention is a power source apparatus that can connect with external systems and is provided with the power storage device for an aspect of the present invention, and with a power conversion device that is controlled by the power storage device system control section to perform power conversion between the power storage device battery systems and the outside.

In this power source apparatus, power conversion is performed between the battery systems and the outside by the power conversion device. By controlling the power conversion device with the system control section of the power storage device, charging and discharging of the plurality of battery modules is controlled. Consequently, over-charging, over-discharging, and degradation can be prevented in the plurality of battery modules.

Since this power source apparatus uses the battery systems described above, abnormality in a group of battery cells can be rapidly detected. In addition, detection results from a plurality of abnormality detection sections can be quickly transmitted to the outside without making the communication circuitry complex.

With the present invention, abnormality detection results for a group of battery cells can be rapidly transmitted to the outside without making the communication circuitry complex. The above and further objects of the present invention as well as the features thereof will become more apparent from the following detailed description to be made in conjunction with the accompanying drawings.

DETAILED DESCRIPTION OF THE EMBODIMENTS

[1] First Embodiment

The following describes the first embodiment of the present invention based on the figures. The battery system for this embodiment is installed on-board an electric-powered vehicle (such as an electric automobile) that uses electricity as the source of driving power. The battery system can also be used in applications having a plurality of battery cells that can be charged and discharged such as a power storage device or other equipment for the general population.

(1) Battery System Structure

Figure 1:
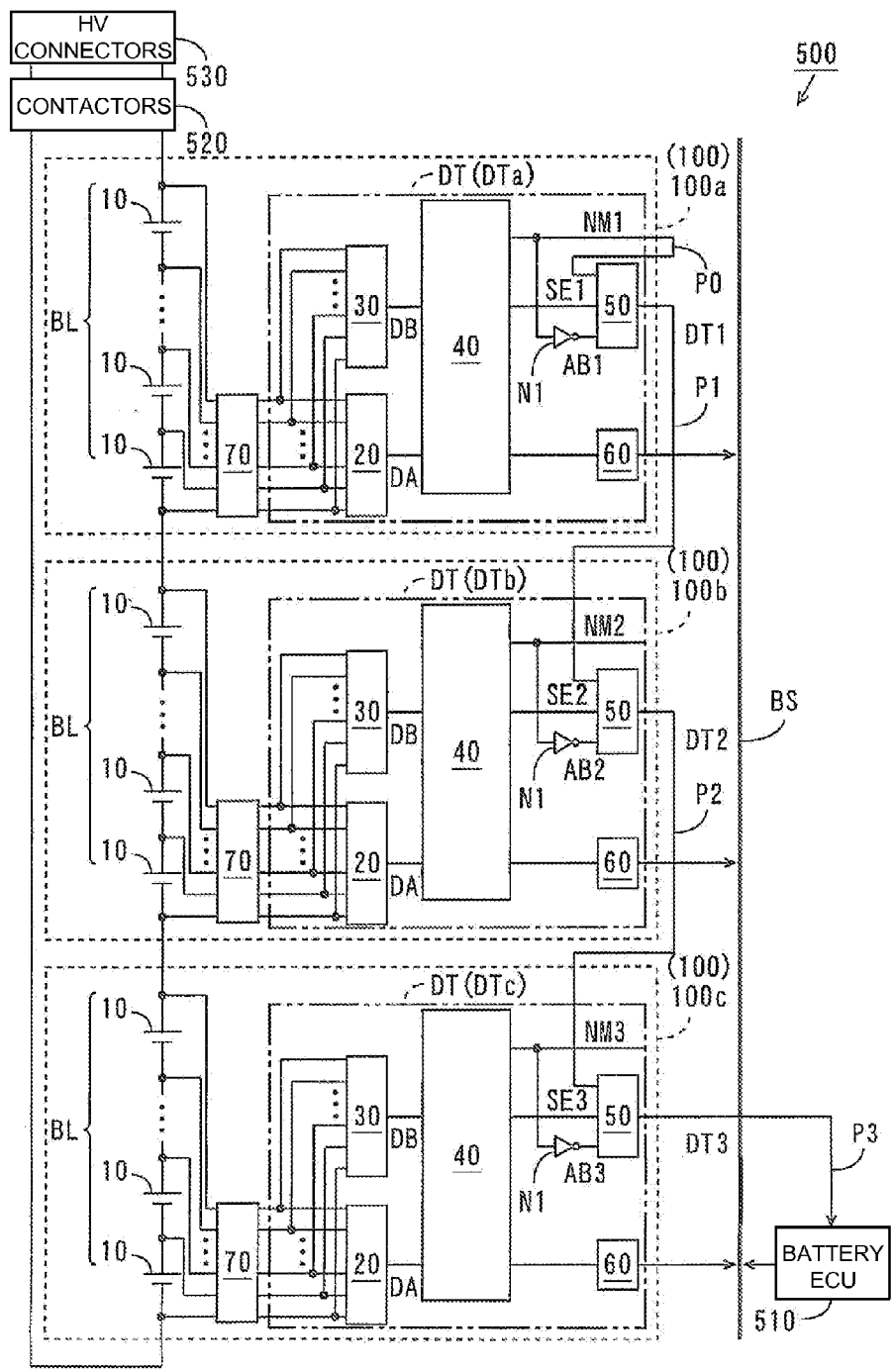
FIG. 1 is a block diagram showing the structure of a battery system for the first embodiment.

FIG. 1 is a block diagram showing the structure of a battery system for the first embodiment. As shown in FIG. 1, the battery system 500 is provided with a plurality of battery modules 100, a battery electronic control unit (ECU) 510, contactors 530, and high-voltage connectors (HV connectors) 530. The battery system 500 for the present embodiment includes three battery modules 100. In the following description, the three battery modules 100 are labeled battery modules 100a, 100b, and 100c (100a-c).

Each of the battery modules 100a-c includes a group of battery cells BL made up of a plurality of battery cells 10, a state detection section DT, and an equalizing circuit 70. The (plurality of) battery cells 10 in the group of battery cells BL are connected in series. The group of battery cells BL is retained as a single unit battery block, and the battery blocks are disposed in an adjacent manner. A plurality of thermistors TH are attached to the group of battery cells BL to detect temperature (refer to FIG. 13 described later). Each battery cell 10 is a rechargeable battery such as a lithium ion or nickel hydride battery cell.

The groups of battery cells BL of the plurality of battery modules 100a-c are connected in series via a power supply line. As a result, all the battery cells 10 (of the plurality of battery modules 100a-c) in the battery system 500 are connected in series.

First, operation of each section of the battery module 100a is described below. The state detection section DT detects the state of the corresponding group of battery cells BL. The state detection section DT includes a voltage detection section 20, abnormality detection section 30, processing device 40, signal output circuit 50, and communication driver 60. The voltage detection section 20 detects the terminal voltages of the (plurality of) battery cells 10 and issues detection signals DA that indicate the values of the detected terminal voltages to the processing device 40.

The abnormality detection section 30 determines whether or not there is an abnormality in the (plurality of) battery cells 10 of the corresponding group of battery cells BL and issues detection signals DB indicating the results to the processing device 40. An allowable voltage range is established for the terminal voltage of each battery cell 10 to prevent over-charging and over-discharging. In the present embodiment, the abnormality detection section 30 detects whether or not the terminal voltage of each battery cell 10 is greater than or equal to the upper limit of the allowable voltage range (maximum voltage) or less than or equal to the lower limit of the allowable voltage range (minimum voltage).

When the abnormality detection section 30 determines that at least one battery cell 10 of the corresponding group of battery cells BL has a terminal voltage greater than or equal to the maximum voltage or less than or equal to the minimum voltage, it outputs a detection signal DB with a first duty cycle (for example, 75%). When all of the battery cells 10 of the corresponding group of battery cells BL have terminal voltages within the allowable voltage range, the abnormality detection section 30 outputs a detection signal DB with a second duty cycle (for example, 25%).

The processing device 40 is implemented, for example, with a central processing unit (CPU) and memory, or a microcomputer (or microcontroller). The processing device 40 communicates via the communication driver 60 using a protocol such as Controller Area Network (CAN). Accordingly, the processing device 40 transmits detected voltage values for a plurality of battery cells 10 based on detection signals DA input from the voltage detection section 20 to the battery ECU 510 via the communication driver 60 and communication bus BS. The communication bus BS is implemented by wiring such as flexible printed circuit board or flat cable.

The processing device 40 transmits battery module 100a temperature values (input from thermistors TH described later in FIG. 13) to the battery ECU 510 via the communication driver 60 and communication bus BS. The processing device 40 also performs various computations and makes various decisions using the terminal voltage and temperature values of the plurality of battery cells 10. In addition, the processing device 40 receives various directive signals (commands) from the battery ECU 510 via the communication bus BS and communication driver 60.

Further, the processing device 40 issues normal signals NM1. A normal signal NM1 is a pulse signal with a preset duty cycle (%). A normal signal NM1 generated by the processing device 40 is input to the signal output circuit 50 via a signal line P0. A NOT circuit N1 outputs an abnormal signal AB1 by inverting the normal signal NM1 issued by the processing device 40. An abnormal signal AB1 is a pulse signal with a duty cycle equivalent to the difference between the duty cycle of the normal signal NM1 and 100%.

Further, the processing device 40 outputs a selection signal SE1 based on the detection signal DB input from the abnormality detection section 30 to select either the normal signal NM1 or the abnormal signal AB1. For example, when the detection signal DB is a pulse signal with the first duty cycle (for an abnormality), the selection signal SE1 becomes a HIGH (level), and when the detection signal DB is a pulse signal with the second duty cycle (for normal conditions), the selection signal SE1 becomes a LOW (level).

In this manner, normal and abnormal signal generation, selection signal generation, and communication functions are carried out by the processing device 40. Consequently, the state detection section DT can be reduced in size and its structure can be simplified.

Depending on the selection signal SE1 output by the processing device 40, the signal output circuit 50 selectively outputs either a normal signal NM1 or an abnormal signal AB1 as a detection signal DT1 on the signal line P1. In the present example, the signal output circuit 50 outputs a normal signal NM1 as the detection signal DT1 when the selection signal SE1 is LOW, and outputs an abnormal signal AB1 as the detection signal DT1 when the selection signal SE1 is HIGH.

The equalizing circuit 70 equalizes the terminal voltages of the plurality of battery cells 10 in the group of battery cells BL under the control of the processing device 40.

The structure and operation of battery modules 100b and 100c is the same as that of battery module 100a except for the following aspects.

The processing device 40 of battery module 100b outputs normal signal NM2 and selection signal SE2 instead of normal signal NM1 and selection signal SE1 output by battery module 100a. The NOT circuit N1 of battery module 100b outputs abnormal signal AB2 instead of the abnormal signal AB1 in battery module 100a. In addition, the processing device 40 of battery module 100b transmits battery module 100b temperature values input from thermistors TH (described later in FIG. 13) to the battery ECU 510 via the communication driver 60 and communication bus BS.

Depending on the selection signal SE2 output by the processing device 40, the signal output circuit 50 of battery module 100b selectively outputs either the detection signal DT1 issued from the signal output circuit 50 of battery module 100a over the signal line P1 or the abnormal signal AB2 output from the NOT circuit N1 as a detection signal DT2 transmitted on signal line P2. In the present example, the signal output circuit 50 of battery module 100b outputs detection signal DT1 as the detection signal DT2 when the selection signal SE2 is LOW, and outputs abnormal signal AB2 as the detection signal DT2 when the selection signal SE2 is HIGH.

The processing device 40 of battery module 100c outputs normal signal NM3 and selection signal SE3 instead of normal signal NM1 and selection signal SE1 output by battery module 100a. The NOT circuit N1 of battery module 100c outputs abnormal signal AB3 instead of abnormal signal AB1 in battery module 100a. In addition, the processing device 40 of battery module 100c transmits battery module 100c temperature values input from thermistors TH (described later in FIG. 13) to the battery ECU 510 via the communication driver 60 and communication bus BS.

Depending on the selection signal SE3 output by the processing device 40, the signal output circuit 50 of battery module 100c selectively outputs either the detection signal DT2 issued from the signal output circuit 50 of battery module 100b over the signal line P2 or the abnormal signal AB3 output from the NOT circuit N1 as a detection signal DT3 transmitted on signal line P3. In the present example, the signal output circuit 50 of battery module 100c outputs detection signal DT2 as the detection signal DT3 when the selection signal SE3 is LOW, and outputs abnormal signal AB3 as the detection signal DT3 when the selection signal SE3 is HIGH.

The detection signal DT3 output from the signal output circuit 50 of battery module 100c is input to the battery ECU 510.

In this manner, state detection section DT signal output circuits 50 in battery modules 100a-c sequentially transmit the detection signals DT1, DT2, and DT3. With respect to signal transmission, the state detection section DT signal output circuit 50 of battery module 100a has the highest rank, the state detection section DT signal output circuit 50 of battery module 100b has intermediate rank, and the state detection section DT signal output circuit 50 of battery module 100c has the lowest rank.

The battery ECU 510 computes the charge capacity of each battery cell 10 based on terminal voltage values for the (plurality of) battery cells 10 input from the processing devices 40 of the battery modules 100a-c. The battery ECU 510 also judges whether or not there is an abnormality in any of the battery modules 100a-c based on the terminal voltage values for the (plurality of) battery cells 10 input from the processing devices 40 of the battery modules 100a-c. For example, a battery module 100a-c abnormality includes battery cell 10 over-charging, over-discharging, and abnormal temperature.

In addition, the battery ECU 510 determines whether or not there is a battery cell 10 terminal voltage abnormality in the (plurality of) battery cells 10 of battery modules 100a-c based on the detection signal DT3 output from the signal output circuit 50 of battery module 100c.

The power supply line connected to the highest potential positive electrode of battery module 100a and the power supply line connected to the lowest potential negative electrode of battery module 11c are connected to contactors 520. Further, the contactors 520 are connected to a load such as the electric-powered vehicle motor via the HV connectors 530. In the case of an abnormality in the battery modules 100a-c, the battery ECU 510 switches the contactors 520 to the OFF state. This action prevents abnormal battery module 100a-c heating during a malfunction because no current flows in the plurality of battery cells 10.

The battery ECU 510 is connected to a primary control section 300 (refer to FIG. 14 described later) in the electric-powered vehicle via bus lines. The charge capacity (battery cell 10 charge capacity) of each battery module 100a-c is input to the primary control section 300 from the battery ECU 510. The primary control section 300 regulates mechanical power (for example, motor rotation speed) in the electric-powered vehicle based on the charge capacity. Further, when the charge capacity in each battery module 100a-c becomes low, the primary control section 300 controls an electricity generating device (not illustrated) connected to the power supply lines to charge each battery module 100a-c.

(2) Voltage Detection Section and Abnormality Detection Section Structure

Figure 2:
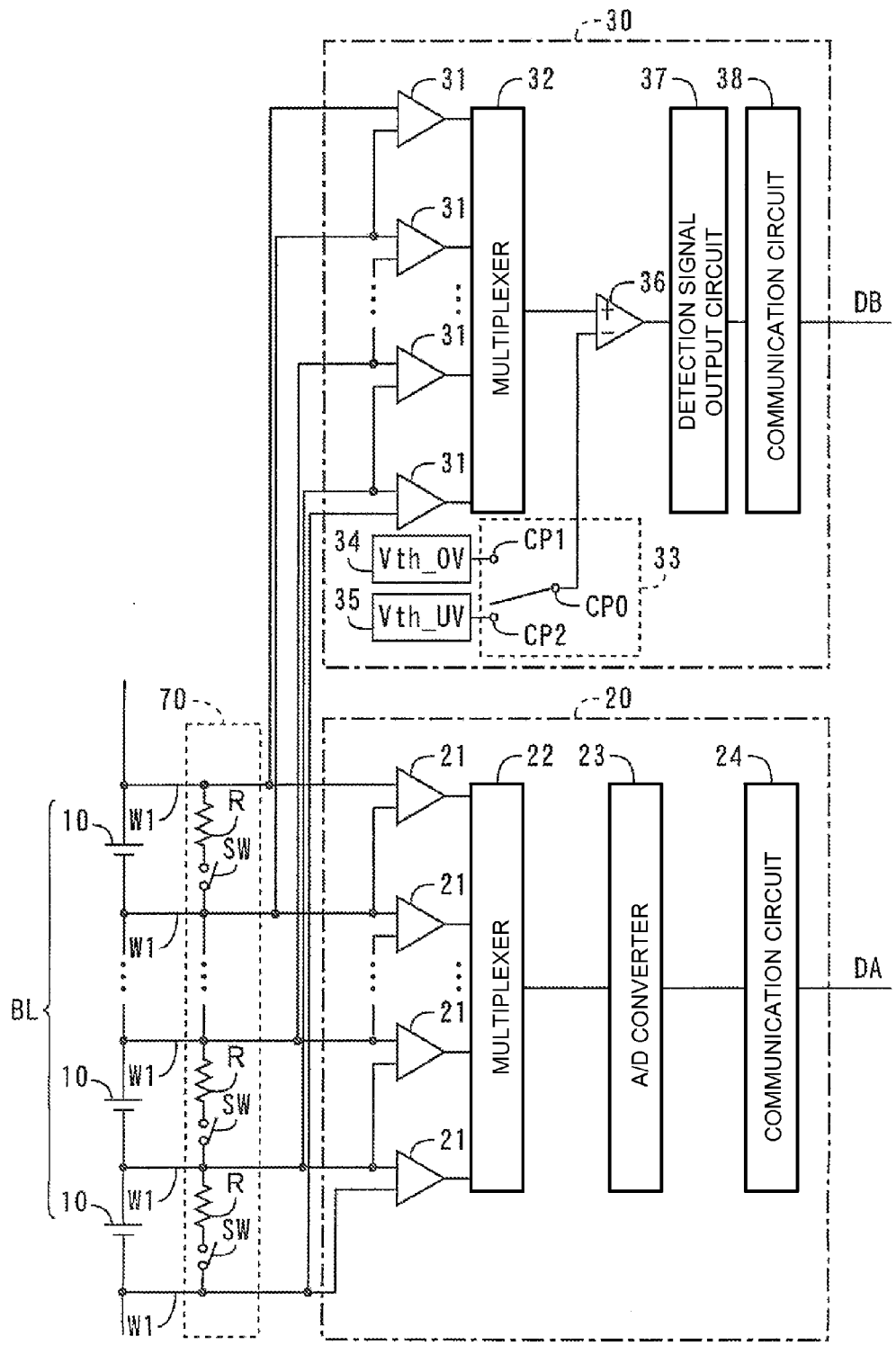
FIG. 2 is a block diagram showing the structure of the voltage detection section, abnormality detection section, and equalizing circuitry.

FIG. 2 is a block diagram showing the structure of the voltage detection section 20, abnormality detection section 30, and equalizing circuitry 70.

The voltage detection section 20 is implemented, for example, by an application specific integrated circuit (ASIC). The voltage detection section 20 includes a plurality of difference amplifiers 21, a multiplexer 22, an analog-to-digital (A/D) converter 23, and a communication circuit 24.

Each difference amplifier 21 has two input terminals and an output terminal. Each difference amplifier 21 amplifies the difference between the voltages applied to the two input terminals and outputs the amplified voltage from the output terminal. The two input terminals of each difference amplifier 21 are connected to the positive and negative electrodes of a corresponding battery cell 10 by conducting lines W1. With this arrangement, the voltage difference between the positive and negative electrodes of each battery cell 10 is amplified by each difference amplifier 21. The output voltage of each difference amplifier 21 is equivalent to the terminal voltage of each battery cell 10. Terminal voltages output from the plurality of difference amplifiers 21 are input to the multiplexer 22. The multiplexer 22 sequentially outputs the terminal voltages input from the (plurality of) difference amplifiers 21 to the A/D converter 23.

The A/D converter 23 converts the terminal voltages output from the multiplexer 22 to digital values. Digital values from the A/D converter 23 are input to the processing device 40 (refer to FIG. 1) as detection signals DA via the communication circuit 24.

The abnormality detection section 30 is implemented, for example, by an ASIC chip. The abnormality detection section 30 includes a plurality of difference amplifiers 31, a multiplexer 32, a switching circuit 33, reference voltage output sections 34, 35, a comparator 36, a detection signal output circuit 37, and a communication circuit 38.

Each difference amplifier 31 has two input terminals and an output terminal. Each difference amplifier 31 amplifies the difference between the voltages applied to the two input terminals and outputs the amplified voltage from the output terminal. The two input terminals of each difference amplifier 31 are connected to the positive and negative electrodes of a corresponding battery cell 10 by conducting lines W1. With this arrangement, the voltage difference between the positive and negative electrodes of each battery cell 10 is amplified by each difference amplifier 31. The output voltage of each difference amplifier 31 is equivalent to the terminal voltage of each battery cell 10. Terminal voltages output from the plurality of difference amplifiers 31 are input to the multiplexer 32. The multiplexer 32 sequentially outputs the terminal voltages input from the (plurality of) difference amplifiers 21 to the comparator 36.

The switching circuit 33 has three terminals CP0, CP1, and CP2. The reference voltage output section 34 outputs an upper limit threshold voltage Vth_O to the switching circuit 33 terminal CP1, and reference voltage output section 35 outputs a lower limit threshold voltage Vth_U to switching circuit 33 terminal CP2. The upper limit threshold voltage Vth_O is set, for example, to 4.2V (greater than or equal to 4.19V and less than or equal to 4.21V), and the lower limit threshold voltage Vth_U is set, for example, to 2.0V (greater than or equal to 1.99V and less than or equal to 2.01V).

The comparator 36 has two input terminals and an output terminal. One of the comparator 36 input terminals is connected to the multiplexer 32. The other comparator 36 input terminal is connected to the switching circuit 33 terminal CP0. The switching circuit 33 terminal CP0 is switched between terminals CP1 and CP2 with a given periodicity. With this arrangement, a terminal voltage output from the multiplexer 32 is input to one input terminal of the comparator 36, while the upper limit threshold voltage Vth_O and lower limit threshold voltage Vth_U are alternately input to the other input terminal of the comparator 36. Accordingly, the comparator 36 successively compares battery cell 10 terminal voltages input from the multiplexer 32 with the upper limit threshold voltage Vth_O and lower limit threshold voltage Vth_U, and outputs signals indicating the comparison results to the detection signal output circuit 37.

Based on the comparator 36 output signal, the detection signal output circuit 37 determines whether or not the terminal voltage of at least one of the (plurality of) battery cells 10 is greater than or equal to the upper limit threshold voltage Vth_O or less than or equal to the lower limit threshold voltage Vth_U.

When the terminal voltage of at least one of the battery cells 10 is greater than or equal to the upper limit threshold voltage Vth_O or less than or equal to the lower limit threshold voltage Vth_U, the detection signal output circuit 37 issues a detection signal DB with the first duty cycle (for example, 75%) to the processing device 40 (refer to FIG. 1) via the communication circuit 38. When the terminal voltages of all the battery cells 10 exceed the lower limit threshold voltage Vth_U and are below the upper limit threshold voltage Vth_O, the detection signal output circuit 37 issues a detection signal DB with the second duty cycle (for example, 25%) to the processing device 40 via the communication circuit 38.

The equalizing circuit 70 includes a plurality of series-connected resistors R and switching devices SW. A series-connected resistor R and switching device SW is connected between the positive and negative electrodes of each battery cell 10. The switching devices SW are controlled ON and OFF by the battery ECU 510 via the processing device 40 (FIG. 1). Under normal conditions, the switching devices SW are in the OFF state.

(3) Signal Output Circuit Structure

Figure 3:
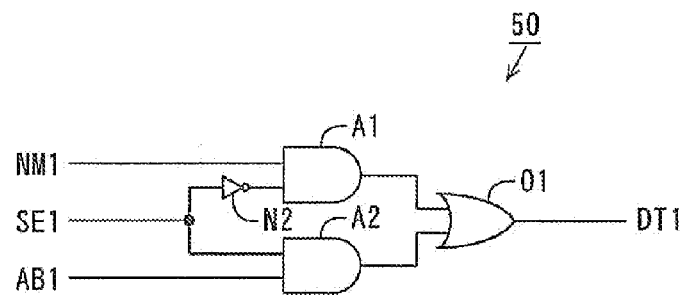
FIG. 3 is a block diagram showing signal output circuit structure.

FIG. 3 is a block diagram showing signal output circuit 50 structure. FIG. 3 shows the structure of the signal output circuit 50 in battery module 100a. The signal output circuit 50 includes a NOT circuit N2, two AND circuits A1 and A2, and an OR circuit O1.

The normal signal NM1 is input to one of the AND circuit A1 input terminals. The selection signal SE1 is input to the other input terminal of AND circuit A1 through the NOT circuit N2. The selection signal SE1 is also input to one of the AND circuit A2 input terminals. The abnormal signal AB1 is input to the other input terminal of AND circuit A2. The output signal from AND circuit A1 is input to one of the OR circuit O1 input terminals, and the output signal from AND circuit A2 is input to the other OR circuit O1 input terminal. The detection signal DT1 is output from the OR circuit O1.

When the selection signal SE1 indicates normal conditions (a LOW level signal), the normal signal NM1 is output from the OR circuit O1 as the detection signal DT1. When the selection signal SE1 indicates an abnormality (a HIGH level signal), the abnormal signal AB1 is output from the OR circuit O1 as the detection signal DT1.

The signal output circuits 50 of battery modules 100b and 100c have the same structure and operation as the signal output circuit 50 in FIG. 3 except in the following respects. Instead of normal signal NM1, abnormal signal AB1, and selection signal SE1, the input-side signals are detection signals DT1, DT2, abnormal signals AB2, AB3, and selection signals SE2, SE3, and instead of the output-side detection signal DT1, detection signals DT2 and DT3 are output.

(4) Example of Printed Circuit Board Structure

Figure 4:
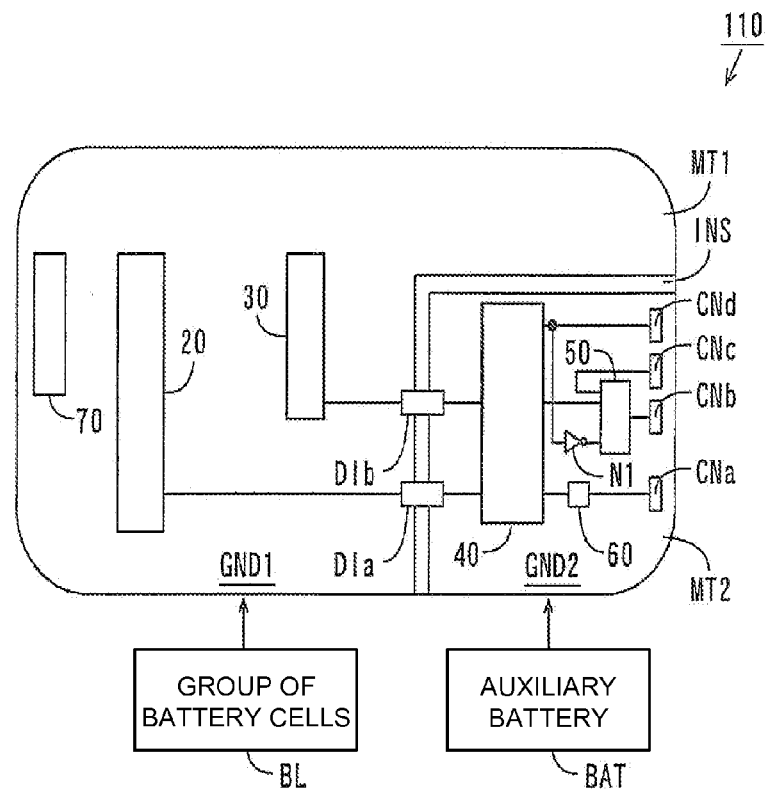
FIG. 4 is a plan view showing a typical example of printed circuit board structure.

Each state detection section DT and equalizing circuit 70 in FIG. 1 is mounted on a (rigid) printed circuit board. FIG. 4 is a plan view showing a typical example of printed circuit board structure. As shown in FIG. 4, the voltage detection section 20, abnormality detection section 30, processing device 40, signal output circuit 50, communication driver 60, equalizing circuit 70, connectors CNa-d, and isolation devices D1a, D1b are mounted on the printed circuit board 110. Further, the printed circuit board 110 has a first device mounting region MT1, a second device mounting region MT2, and an isolation region INS band.

The second device mounting region MT2 is established in one corner region of the printed circuit board 110. The isolation region INS is formed as a band extending around the outside of the second device mounting region MT2. The first device mounting region MT1 is established in the remaining area of the printed circuit board 110. The first device mounting region MT1 and the second device mounting region MT2 are separated by the isolation region INS. Accordingly, the first device mounting region MT1 and the second device mounting region MT2 are electrically isolated from each other by the isolation region INS.

The voltage detection section 20, abnormality detection section 30, and equalizing circuit 70 are mounted in the first device mounting region MT1. The plurality of battery cells 10 in the group of battery cells BL are connected to the voltage detection section 20, abnormality detection section 30, and equalizing circuit 70 and implement their power supply.

In regions other than the mounting area for the voltage detection section 20, abnormality detection section 30, and equalizing circuit 70 and area for their connecting runs, the first device mounting region MT1 is patterned by ground-plane GND1. The ground-plane GND1 is maintained at the ground potential (ground reference voltage) for the battery cells 10 in the group of battery cells BL.

The processing device 40, signal output circuit 50, communication driver 60, NOT circuit N1, and connectors CNa-d are mounted in the second device mounting region MT2. A (non-driving) auxiliary battery BAT is connected to the processing device 40, signal output circuit 50, and communication driver 60 and serves as their power supply.

In regions other than the mounting area for the processing device 40, signal output circuit 50, communication driver 60, and connectors CNa-d and area for their connecting runs, the second device mounting region MT2 is patterned by ground-plane GND2. The ground-plane GND2 is maintained at the ground potential (ground reference voltage) of the auxiliary battery BAT.

In this manner, the voltage detection section 20, abnormality detection section 30, and equalizing circuit 70 are supplied with power from the battery cells 10 of the group of battery cells BL, while the processing device 40, the signal output circuit 50, and communication driver 60 are powered by the auxiliary battery BAT. As a result, the processing device 40, the signal output circuit 50, and communication driver 60 can operate stably and independently from the voltage detection section 20, abnormality detection section 30, and equalizing circuit 70.

The isolation devices D1$a$, D1$b$ are mounted straddling the isolation region INS. The isolation device D1$a$ transmits signals between the voltage detection section 20 and the processing device 40 while electrically isolating the voltage detection section 20 from the processing device 40. The isolation device D1$b$ transmits signals between the abnormality detection section 30 and the processing device 40 while electrically isolating the abnormality detection section 30 from the processing device 40. Devices such as digital isolators or photo-couplers can be used as the isolation devices D1$a$, D1$b$. In the present embodiment, digital isolators are used as the isolation devices D1$a$, D1$b$.

In the second device mounting region MT2, the processing device 40 is connected to the connector CNa via the communication driver 60. With this connection, terminal voltage values of the (plurality of) battery cells 10 and temperature values of the battery modules 100$a$-$c$ output from the processing device 40 are made available at the connector CNa through the communication driver 60. The connector CNa connects to the communication bus BS of FIG. 1.

The connector CNb is connected to the output terminal of the OR circuit O1 of the signal output circuit 50 in FIG. 3. Further, the connectors CNb of battery modules 100$a$-$c$ connect to the signal lines P1, P2, and P3 respectively as shown in FIG. 1. The connector CNc is connected to one of the input terminals of the AND circuit A1 of the signal output circuit 50 in FIG. 3. The connector CNc of battery module 100$a$ is connected to connector CNd via the signal line P0 as shown in FIG. 1. The connectors CNc of battery modules 100$b$ and 100$c$ are connected respectively to signal lines P1 and P2 as shown in FIG. 1. The normal signal NM1 issued by the processing device 40 is made available at connector CNd as shown in FIG. 1.

Note that connector CNd does not necessarily need to be provided on the printed circuit boards 110 for battery modules 100$b$ and 100$c$.

(5) Abnormal Battery Cell Terminal Voltage Detection

Figure 5:
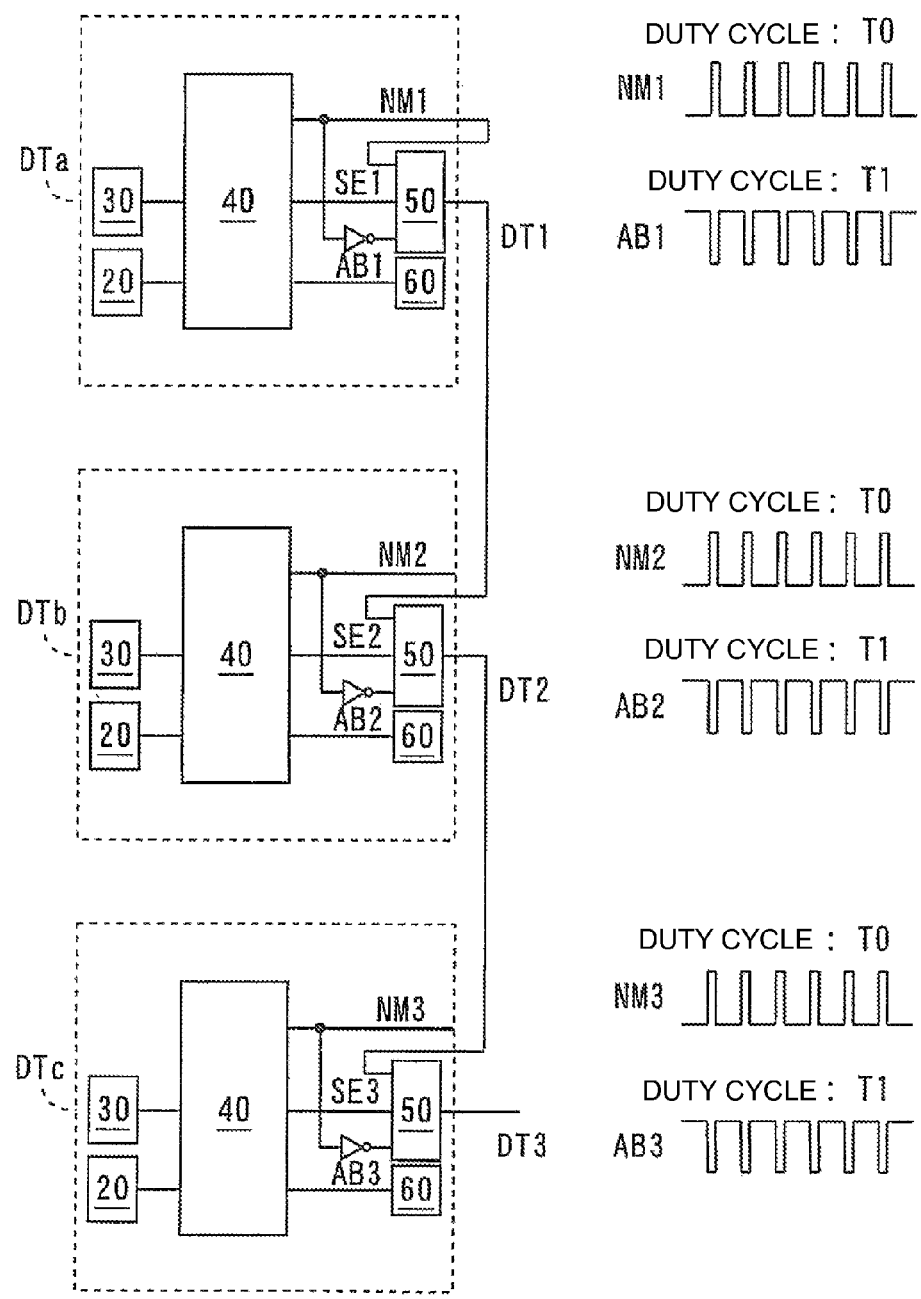
FIG. 5 is a diagram showing normal and abnormal signal waveforms output from the processing device of each state detection section.

In the following description, abnormality detection sections DT in battery modules 100$a$, 100$b$, and 100$c$ (100$a$-$c$) are referred to as abnormality detection sections DTa, Dtb, and DTc (DTa-c). FIG. 5 is a diagram showing normal signal NM1-3 and abnormal signal AB1-3 waveforms output from the processing devices 40 of the state detection sections DTa-c.

As shown in FIG. 5, a normal signal NM1 generated by the processing device 40 of state detection section DTa has a duty cycle T0. An abnormal signal AB1 generated by the processing device 40 of state detection section DTa has a duty cycle T1. Here, T0<T1 and T0(%)=100−T1. Namely, the duty cycles T0 and T1 are complementary (with respect to 100%).

Similarly, a normal signal NM2 generated by the processing device 40 of state detection section DTb also has duty cycle T0, and an abnormal signal AB2 generated by the processing device 40 of state detection section DTb has duty cycle T1.

Further, a normal signal NM3 generated by the processing device 40 of state detection section DTc has duty cycle T0, and an abnormal signal AB3 generated by the processing device 40 of state detection section DTc has duty cycle T1.

Figure 6:
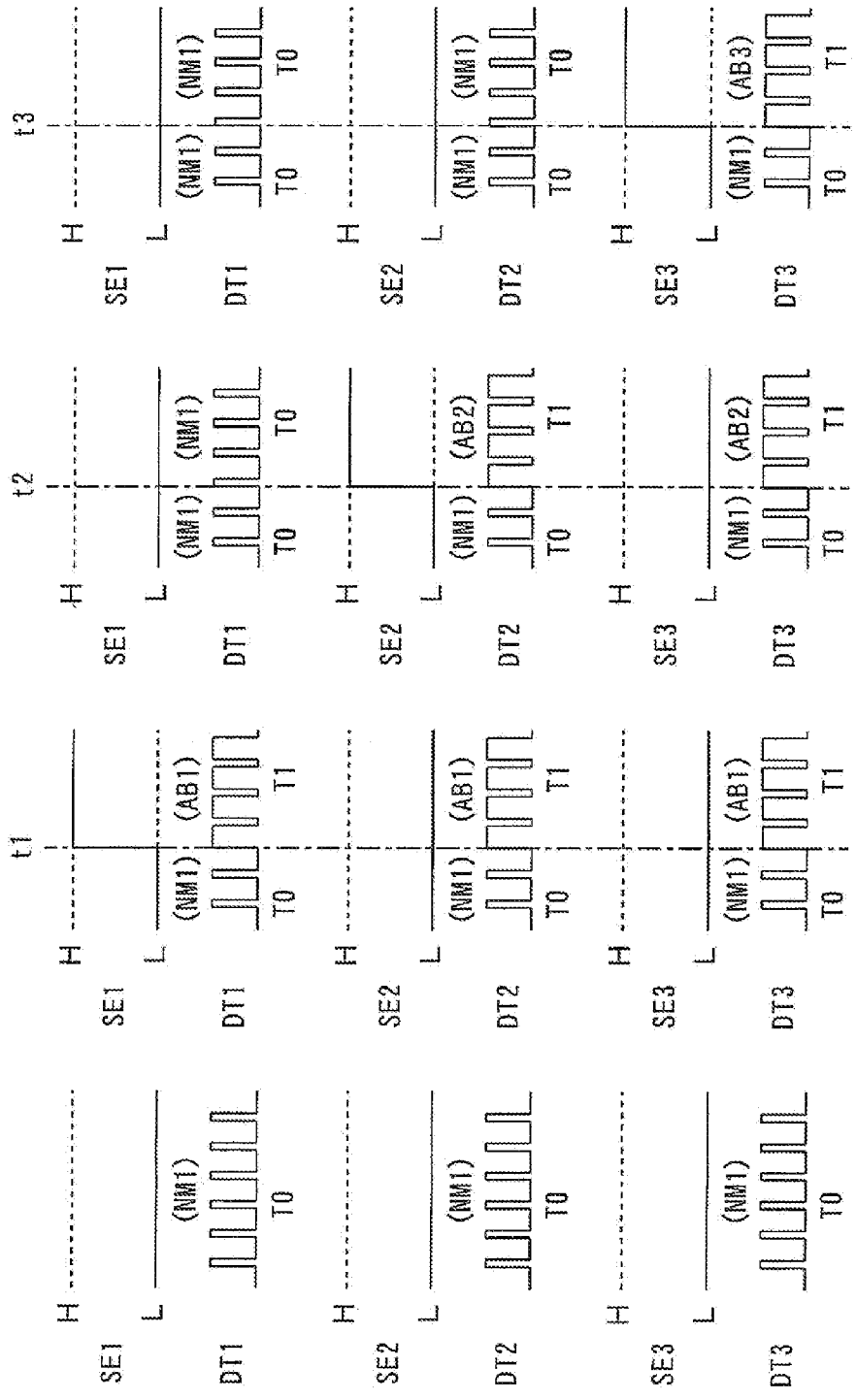
FIGS. 6A-6D are diagrams showing selection signal and detection signal waveforms in each state detection section, respectively.

FIG. 6 is a diagram showing selection signal SE1-3 and detection signal DT1-3 waveforms in each state detection section DTa-c.

FIG. 6A shows selection signals SE1-3 and detection signals DT1-3 when the (plurality of) battery cells 10 in battery modules 100$a$-$c$ have terminal voltages within the allowable limits. In this case, a LOW level selection signal SE1 is maintained by the highest rank state detection section DTa. Therefore, the highest rank signal output circuit 50 outputs a normal signal NM1 as the detection signal DT1. A LOW level selection signal SE2 is maintained by the intermediate rank state detection section DTb. Therefore, the intermediate rank signal output circuit 50 outputs the detection signal DT1 (normal signal NM1) issued by the highest rank signal output circuit 50 as the detection signal DT2. A LOW level selection signal SE3 is maintained by the lowest rank state detection section DTc. Therefore, the lowest rank signal output circuit 50 outputs the detection signal DT2 (normal signal NM1) issued by the intermediate rank signal output circuit 50 as the detection signal DT3.

In this manner, a normal signal NM1 is sequentially transmitted from the highest rank signal output circuit 50, to the intermediate rank signal output circuit 50, to the lowest rank signal output circuit 50, and input to the battery ECU 510. As a result, the battery ECU 510 can rapidly determine that the terminal voltages of the (plurality of) battery cells 10 in each battery module 100a-c are normal.

FIG. 6B shows selection signals SE1-3 and detection signals DT1-3 when the terminal voltage of a battery cell 10 in battery module 100a goes outside the allowable limits at time t1. In this case, the selection signal SE1 rises from a LOW level to a HIGH level at time t1 in the highest rank state detection section DTa. Therefore, the highest rank signal output circuit 50 outputs an abnormal signal AB1 at time t1 as the detection signal DT1. A LOW level selection signal SE2 is maintained by the intermediate rank state detection section DTb. Therefore, the intermediate rank signal output circuit 50 outputs the detection signal DT1 (abnormal signal AB1 at time t1) issued by the highest rank signal output circuit 50 as the detection signal DT2. A LOW level selection signal SE3 is maintained by the lowest rank state detection section DTc. Therefore, the lowest rank signal output circuit 50 outputs the detection signal DT2 (abnormal signal AB1 at time t1) issued by the intermediate rank signal output circuit 50 as the detection signal DT3.

In this manner, an abnormal signal AB1 is sequentially transmitted from the highest rank signal output circuit 50, to the intermediate rank signal output circuit 50, to the lowest rank signal output circuit 50, and input to the battery ECU 510. As a result, the battery ECU 510 can rapidly determine that a terminal voltage abnormality has developed in a battery cell 10 in one of the battery modules 100a-c.

FIG. 6C shows selection signals SE1-3 and detection signals DT1-3 when the terminal voltage of a battery cell 10 in battery module 100b goes outside the allowable limits at time t2. In this case, a LOW level selection signal SE1 is maintained by the highest rank state detection section DTa. Therefore, the highest rank signal output circuit 50 outputs a normal signal NM1 as the detection signal DT1. The selection signal SE2 rises from a LOW level to a HIGH level at time t2 in the intermediate rank state detection section DTb. Therefore, the intermediate rank signal output circuit 50 outputs an abnormal signal AB2 at time t2 as the detection signal DT2. A LOW level selection signal SE3 is maintained by the lowest rank state detection section DTc. Therefore, the lowest rank signal output circuit 50 outputs the detection signal DT2 (abnormal signal AB2 at time t2) issued by the intermediate rank signal output circuit 50 as the detection signal DT3.

In this manner, even when the detection signal DT1 output from the highest rank signal output circuit 50 is a normal signal NM1, an abnormal signal AB2 output from the intermediate rank signal output circuit 50 is sequentially transmitted to the lowest rank signal output circuit 50 and input to the battery ECU 510. As a result, the battery ECU 510 can rapidly determine that a terminal voltage abnormality has developed in a battery cell 10 in one of the battery modules 100a-c.

FIG. 6D shows selection signals SE1-3 and detection signals DT1-3 when the terminal voltage of a battery cell 10 in battery module 100c goes outside the allowable limits at time t3. In this case, a LOW level selection signal SE1 is maintained by the highest rank state detection section DTa. Therefore, the highest rank signal output circuit 50 outputs a normal signal NM1 as the detection signal DT1. A LOW level selection signal SE2 is maintained by the intermediate rank state detection section DTb. Therefore, the intermediate rank signal output circuit 50 outputs the detection signal DT1 (normal signal NM1) issued by the highest rank signal output circuit 50 as the detection signal DT2. The selection signal SE3 rises from a LOW level to a HIGH level at time t3 in the lowest rank state detection section DTc. Therefore, the lowest rank signal output circuit 50 outputs an abnormal signal AB3 at time t3 as the detection signal DT3.

In this manner, even when the detection signal DT1 output from the highest rank signal output circuit 50 and the detection signal DT2 output from the intermediate rank signal output circuit 50 are the normal signal NM1, an abnormal signal AB3 output from the lowest rank signal output circuit 50 is input to the battery ECU 510. As a result, the battery ECU 510 can rapidly determine that a terminal voltage abnormality has developed in a battery cell 10 in one of the battery modules 100a-c.

(6) Detection of Shorts-to-Ground and Shorts-to-Power Supply

If a state detection section DTa-c signal line becomes disconnected, short circuits to ground potential, and is held at ground potential, that condition is called a short-to-ground (stuck LOW). If a state detection section DTa-c signal line becomes disconnected, short circuits to a power supply line, and is held at the power supply potential, that condition is called a short-to-power supply (stuck HIGH).

In the present embodiment, if a signal line connected to connector CNc (refer to FIG. 4) on a printed circuit board 110 open circuits, the connector CNc on that printed circuit board 110 will be held at the ground potential of the auxiliary battery BAT (refer to FIG. 4). This results in a short-to-ground.

Figure 7:
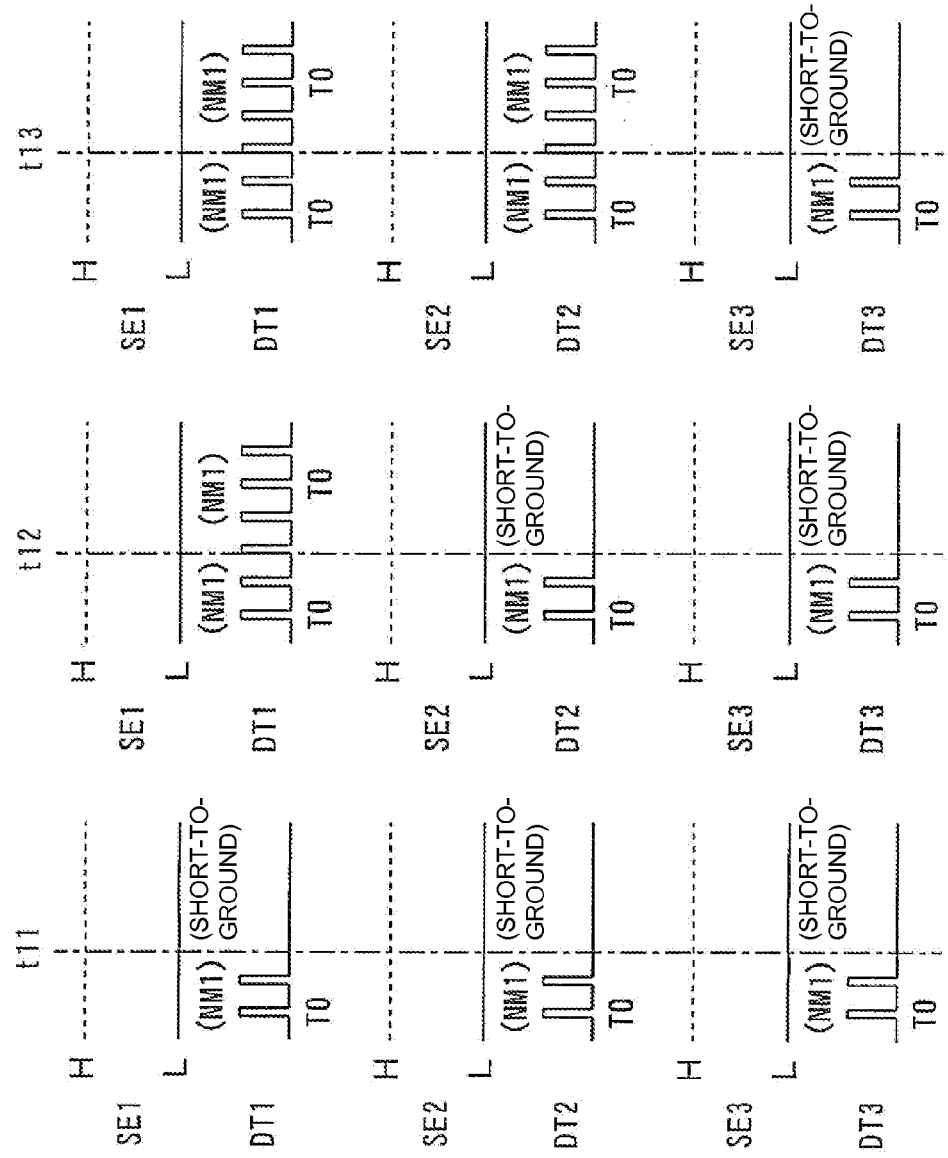
FIGS. 7A-7C are diagrams showing selection signal and detection signal waveforms in each state detection section when a short-to-ground has occurred, respectively.

FIG. 7 is a diagram showing selection signal SE1-3 and detection signal DT1-3 waveforms in each state detection section DTa-c when a short-to-ground occurs. Here, the selection signals SE1-3 maintain a LOW level when the short-to-ground occurs.

FIG. 7A shows selection signals SE1-3 and detection signals DT1-3 when a short-to-ground occurs at time t11 in the state detection section DTa of battery module 100a. If, for example, a short-to-ground develops in signal line P0 at time t11, the highest rank signal output circuit 50 will output a LOW level detection signal DT1. As a result, the intermediate rank signal output circuit 50 outputs the LOW level detection signal DT1 at time t11 as the (LOW level) detection signal DT2. Further, the lowest rank signal output circuit 50 outputs the LOW level detection signal DT2 at time t11 as the (LOW level) detection signal DT3.

In this manner, a LOW level signal is sequentially transmitted from the highest rank signal output circuit 50, to the intermediate rank signal output circuit 50, to the lowest rank signal output circuit 50, and input to the battery ECU 510. Consequently, the battery ECU 510 can rapidly determine that a short-to-ground has occurred in one of the state detection sections DTa-c.

FIG. 7B shows selection signals SE1-3 and detection signals DT1-3 when a short-to-ground occurs at time t12 in the state detection section DTb of battery module 100b. In this case, the highest rank signal output circuit 50 outputs a normal signal NM1 as the detection signal DT1. If, for example, a short-to-ground develops in signal line P1 at time t12, the intermediate rank signal output circuit 50 will output a LOW level detection signal DT2. As a result, the lowest rank signal output circuit 50 outputs the LOW level detection signal DT2 at time t12 as the (LOW level) detection signal DT3.

In this manner, even when the detection signal DT1 output from the highest rank signal output circuit 50 is a normal signal NM1, a LOW level signal can be sequentially transmitted from the intermediate rank signal output circuit 50, to the lowest rank signal output circuit 50, and input to the battery ECU 510. Consequently, the battery ECU 510 can rapidly determine that a short-to-ground has occurred in one of the state detection sections DTa-c.

FIG. 7C shows selection signals SE1-3 and detection signals DT1-3 when a short-to-ground occurs at time t13 in the state detection section DTc of battery module 100*c*. In this case, the highest rank signal output circuit 50 outputs a normal signal NM1 as the detection signal DT1. Further, the intermediate rank signal output circuit 50 outputs the (normal signal NM1) detection signal DT1 issued by the highest rank state detection section DT1 as the detection signal DT2. If, for example, a short-to-ground develops in signal line P2 at time t13, the lowest rank signal output circuit 50 will output a LOW level detection signal DT3.

In this manner, even when the detection signal DT1 output from the highest rank signal output circuit 50 and the detection signal DT2 output from the intermediate rank signal output circuit 50 are normal signals NM1, a LOW level signal generated by the lowest rank signal output circuit 50 can be input to the battery ECU 510. Consequently, the battery ECU 510 can rapidly determine that a short-to-ground has occurred in one of the state detection sections DTa-c.

Figure 8:
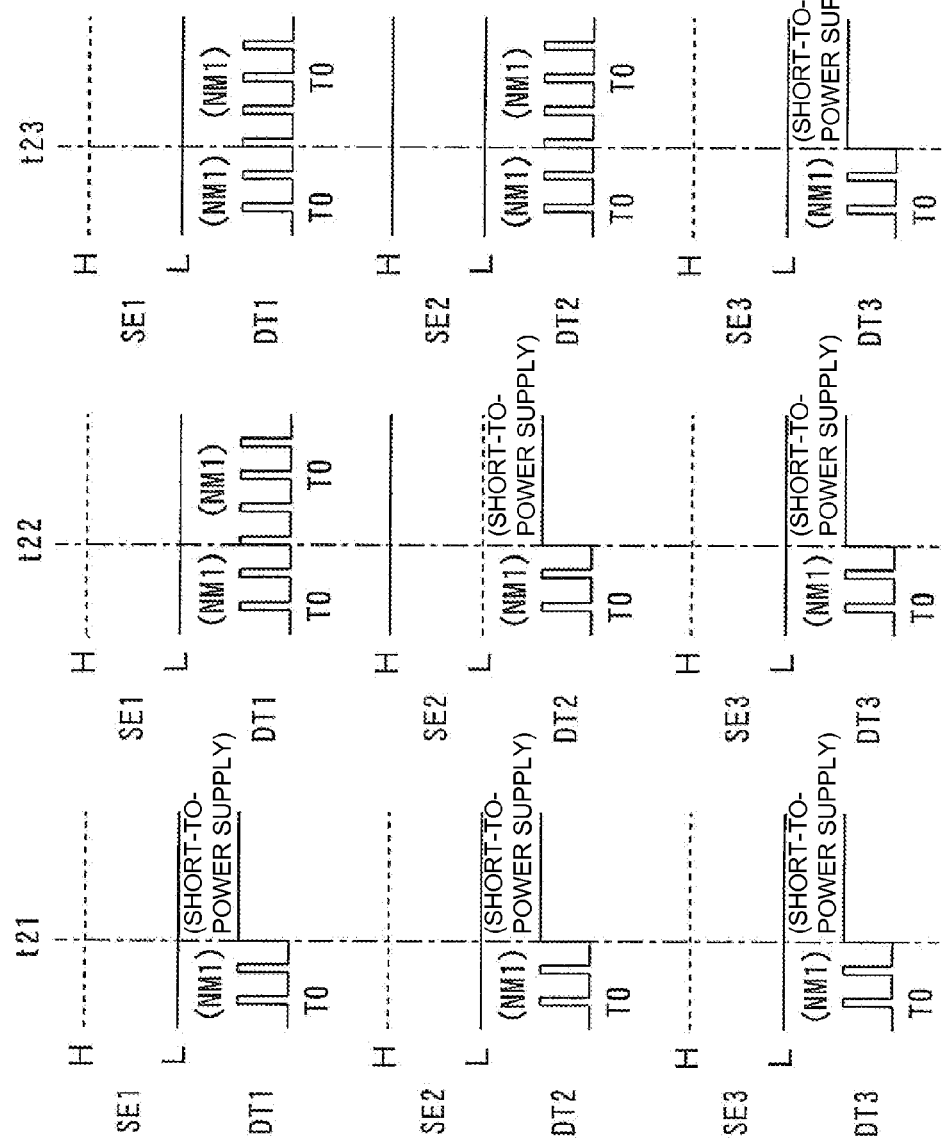
FIGS. 8A-8C are diagrams showing selection signal and detection signal waveforms in each state detection section when a short-to-power supply has occurred, respectively.

FIG. 8 is a diagram showing selection signal SE1-3 and detection signal DT1-3 waveforms in each state detection section DTa-c when a short-to-power supply occurs. Here, the selection signals SE1-3 maintain a HIGH level when the short-to-power supply occurs.

FIG. 8A shows selection signals SE1-3 and detection signals DT1-3 when a short-to-power supply occurs at time t21 in the state detection section DTa of battery module 100*a*. If, for example, a short-to-power supply develops in signal line P0 at time t21, the highest rank signal output circuit 50 will output a HIGH level detection signal DT1. As a result, the intermediate rank signal output circuit 50 outputs the HIGH level detection signal DT1 at time t21 as the (HIGH level) detection signal DT2. Further, the lowest rank signal output circuit 50 outputs the HIGH level detection signal DT2 at time t21 as the (HIGH level) detection signal DT3.

In this manner, a HIGH level signal is sequentially transmitted from the highest rank signal output circuit 50, to the intermediate rank signal output circuit 50, to the lowest rank signal output circuit 50, and input to the battery ECU 510. Consequently, the battery ECU 510 can rapidly determine that a short-to-power supply has occurred in one of the state detection sections DTa-c.

FIG. 8B shows selection signals SE1-3 and detection signals DT1-3 when a short-to-power supply occurs at time t22 in the state detection section DTb of battery module 100*b*. In this case, the highest rank signal output circuit 50 outputs a normal signal NM1 as the detection signal DT1. If, for example, a short-to-power supply develops in signal line P1 at time t22, the intermediate rank signal output circuit 50 will output a HIGH level detection signal DT2. As a result, the lowest rank signal output circuit 50 outputs the HIGH level detection signal DT2 at time t22 as the (HIGH level) detection signal DT3.

In this manner, even when the detection signal DT1 output from the highest rank signal output circuit 50 is a normal signal NM1, a HIGH level signal can be sequentially transmitted from the intermediate rank signal output circuit 50, to the lowest rank signal output circuit 50, and input to the battery ECU 510. Consequently, the battery ECU 510 can rapidly determine that a short-to-power supply has occurred in one of the state detection sections DTa-c.

FIG. 8C shows selection signals SE1-3 and detection signals DT1-3 when a short-to-power supply occurs at time t23 in the state detection section DTc of battery module 100*c*. In this case, the highest rank signal output circuit 50 outputs a normal signal NM1 as the detection signal DT1. Further, the intermediate rank signal output circuit 50 outputs the (normal signal NM1) detection signal DT1 issued by the highest rank state detection section DT1 as the detection signal DT2. If, for example, a short-to-power supply develops in signal line P2 at time t23, the lowest rank signal output circuit 50 will output a HIGH level detection signal DT3.

In this manner, even when the detection signal DT1 output from the highest rank signal output circuit 50 and the detection signal DT2 output from the intermediate rank signal output circuit 50 are normal signals NM1, a HIGH level signal generated by the lowest rank signal output circuit 50 can be input to the battery ECU 510. Consequently, the battery ECU 510 can rapidly determine that a short-to-power supply has occurred in one of the state detection sections DTa-c.

(7) Battery Cell Terminal Voltage Equalization

The battery ECU 510 acquires each battery cell 10 terminal voltage value detected by the voltage detection section 20 through the processing device 40 (of each state detection section DT). If the battery ECU 510 determines that the terminal voltage value of a particular battery cell 10 is higher than the terminal voltage values of the other battery cells 10, it sends a command to the processing device 40 to switch ON the switching device SW in the equalizing circuit 70 of that battery cell 10. Accordingly, charge stored in that battery cell 10 is discharged through the corresponding resistor R.

When the battery ECU 510 judges that the terminal voltage value of the particular battery cell 10 has decreased to a value approximately equal to the terminal voltage values of the other battery cells 10, it sends a command to the processing device 40 to switch OFF the switching device SW in the equalizing circuit 70 of that battery cell 10. This maintains the terminal voltages of all the battery cells 10 in an approximately equal state. Consequently, conditions where some battery cells 10 are over-charged or over-discharged can be avoided. As a result, battery cell 10 degradation can be prevented.

(8) Effectiveness

In the battery system 500 of the present embodiment, when the processing device 40 in state detection section DTa generates a HIGH level (abnormal) selection signal SE1, the corresponding signal output circuit 50 outputs abnormal signal AB1 as the detection signal DT1. In this case, the abnormal signal AB1 is transmitted to the battery ECU 510 through the signal output circuits 50 and not through the processing devices 40. Therefore, the abnormal signal AB1 is rapidly input to the battery ECU 510 without making decisions based on the abnormal signal AB1 and detection signals DB input to the intermediate and lowest rank processing devices 40 from the corresponding abnormality detection sections 30.

Further, when the processing device 40 in state detection section DTb generates a HIGH level (abnormal) selection signal SE2, the corresponding signal output circuit 50 outputs the abnormal signal AB2 generated by the processing device 40 regardless of whether the detection signal DT1 from the state detection section DTa is a normal signal NM1 or an abnormal signal AB1. In this case, the abnormal signal AB2 is transmitted to the battery ECU 510 through the signal output circuits 50 and not through the processing devices 40. Therefore, the abnormal signal AB2 is rapidly input to the battery ECU 510 without making decisions based on the abnormal signal AB2 and the detection signal DB input to the lowest rank processing devices 40 from the corresponding abnormality detection section 30.

Similarly, when the processing device 40 in state detection section DTc generates a HIGH level (abnormal) selection signal SE3, the corresponding signal output circuit 50 outputs the abnormal signal AB3 generated by the processing device 40 regardless of whether the detection signal DT2 from the state detection section DTb is a normal signal NM1 or an abnormal signal AB1 or AB2. In this case, the abnormal signal AB3 is transmitted to the battery ECU 510 through the signal output circuits 50 and not through the processing devices 40. Therefore, the abnormal signal AB3 is rapidly input to the battery ECU 510.

In this manner, if an abnormality develops in a battery cell 10 of the battery modules 100*a-c*, the battery ECU 510 can rapidly and reliably detect that abnormal condition. Further, by detecting LOW level signals and HIGH level signals, the battery ECU 510 can rapidly determine if a short-to-ground or short-to-power supply has occurred in one of the state detection sections DTa-c.

In addition, abnormal signals AB1, AB2, AB3 generated by the (plurality of) state detection sections DTa, DTb, DTc are sent to the battery ECU 510 from the signal output circuit 50 of the lowest rank state detection section DTc. Accordingly, there is no need to connect communication circuitry between the battery ECU 510 and each of the (plurality of) state detection sections DTa, DTb, DTc. This allows transmission of abnormal signals AB1, AB2, AB3 generated by the state detection sections DTa, DTb, DTc to the battery ECU 510 without making the communication circuitry complex.

The terminal voltages of the plurality of battery cells 10 in the group of battery cells BL corresponding to each state detection section DT are detected by the voltage detection section 20. Further, the detected terminal voltage values are transmitted to the battery ECU 510. This allows the battery ECU 510 to switch the contactors 520 OFF when a voltage detection section 20 or abnormality detection section 30 detects a battery cell 10 abnormality. This results in battery system 500 reliability improvement.

[2] Second Embodiment

Figure 9:
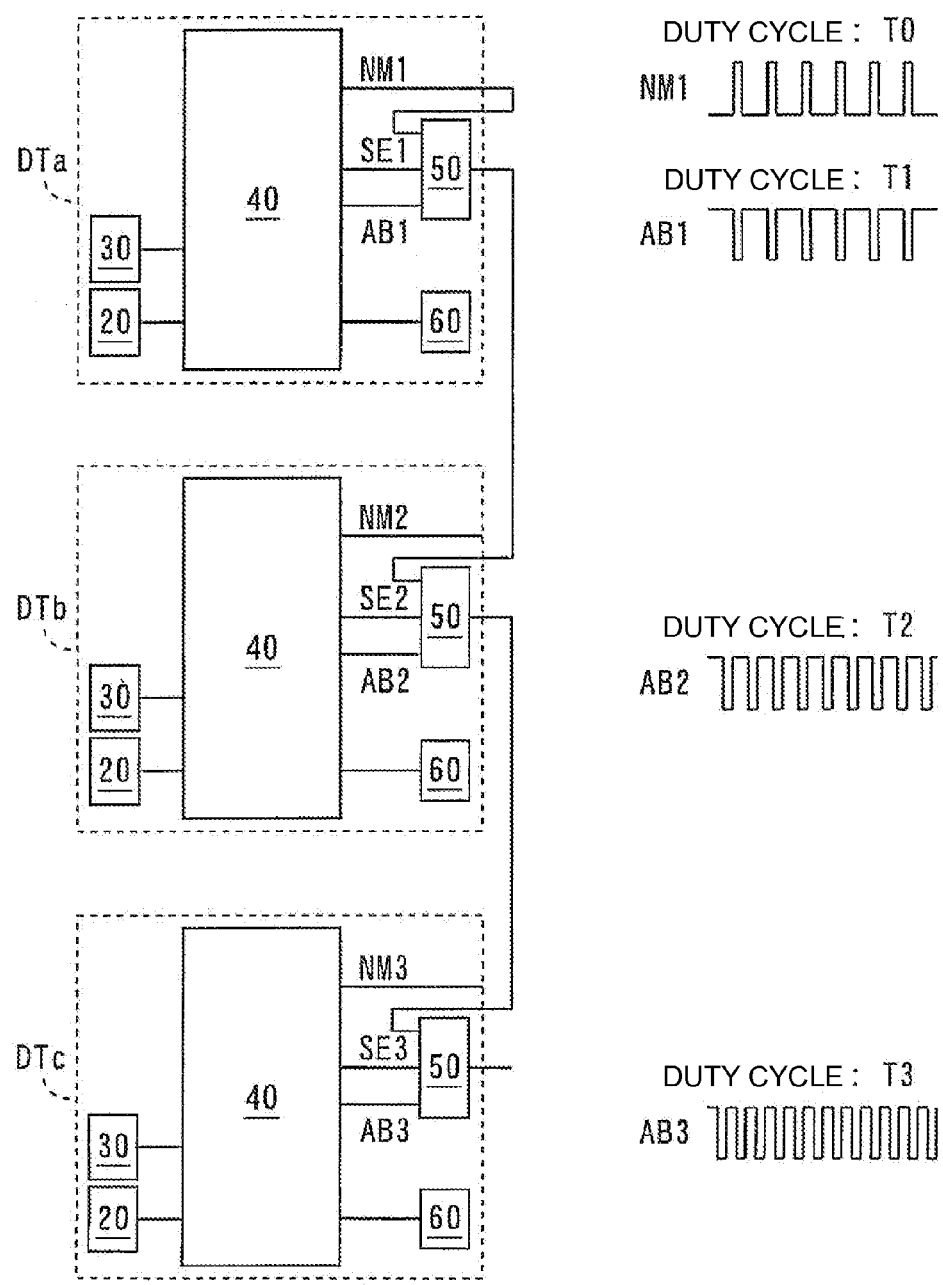
FIG. 9 is a diagram showing normal and abnormal signal waveforms output from the processing devices of the state detection sections for the second embodiment.

The differences between the battery system 500 for the second embodiment and the battery system 500 for the first embodiment are described below. FIG. 9 is a diagram showing the waveforms for normal signal NM1 and abnormal signals AB1, AB2, AB3 output from the processing devices 40 of the state detection sections DTa-c for the second embodiment.

As shown in FIG. 9, a normal signal NM1 generated by the processing device 40 of state detection section DTa has a duty cycle T0. An abnormal signal AB1 generated by the processing device 40 of state detection section DTa has a duty cycle T1. Here, an abnormal signal AB2 generated by the processing device 40 of state detection section DTb has a duty cycle T2. Further, an abnormal signal AB3 generated by the processing device 40 of state detection section DTc has a duty cycle T3. The duty cycles T0, T1, T2, T3 are all different.

Figure 10:
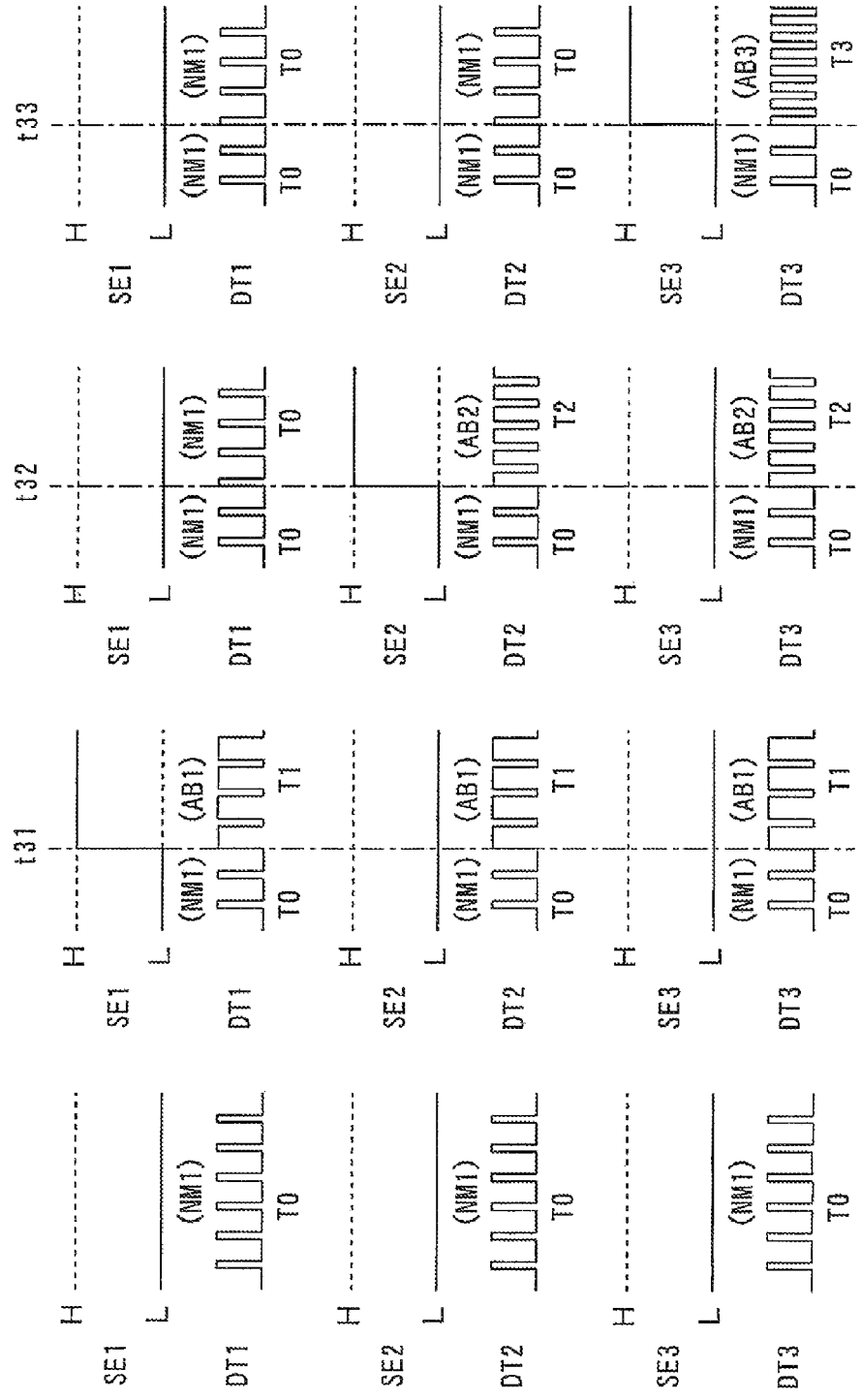
FIGS. 10A-10D are diagrams showing selection signal and detection signal waveforms in each state detection section, respectively.

FIG. 10 is a diagram showing the waveforms for selection signals SE1-3 and detection signals DT1-3 in each state detection section DTa-c.

FIG. 10A shows selection signals SE1-3 and detection signals DT1-3 when the (plurality of) battery cells 10 in battery modules 100*a-c* have terminal voltages within the allowable limits. In this case, a LOW level selection signal SE1 is maintained in the highest rank state detection section DTa. Therefore, the highest rank signal output circuit 50 outputs a normal signal NM1 with duty cycle T0 as the detection signal DT1. A LOW level selection signal SE2 is maintained in the intermediate rank state detection section DTb. Therefore, the intermediate rank signal output circuit 50 outputs the detection signal DT1 (normal signal NM1 with duty cycle T0) issued by the highest rank signal output circuit 50 as the detection signal DT2. A LOW level selection signal SE3 is maintained in the lowest rank state detection section DTc. Therefore, the lowest rank signal output circuit 50 outputs the detection signal DT2 (normal signal NM1 with duty cycle T0) issued by the intermediate rank signal output circuit 50 as the detection signal DT3.

In this manner, a normal signal NM1 with duty cycle T0 is sequentially transmitted from the highest rank signal output circuit 50, to the intermediate rank signal output circuit 50, to the lowest rank signal output circuit 50, and input to the battery ECU 510. As a result, the battery ECU 510 can rapidly determine that the terminal voltages of the (plurality of) battery cells 10 in each battery module 100*a-c* are normal.

FIG. 10B shows selection signals SE1-3 and detection signals DT1-3 when the terminal voltage of a battery cell 10 in battery module 100*a* goes outside the allowable limits at time t31. In this case, the selection signal SE1 in the highest rank state detection section DTa rises from a LOW level to a HIGH level at time t31. Therefore, the highest rank signal output circuit 50 outputs an abnormal signal AB1 with duty cycle T1 at time t31 as the detection signal DT1. A LOW level selection signal SE2 is maintained in the intermediate rank state detection section DTb. Therefore, at time t31, the intermediate rank signal output circuit 50 outputs the detection signal DT1 (abnormal signal AB1 with duty cycle T1) issued by the highest rank signal output circuit 50 as the detection signal DT2. A LOW level selection signal SE3 is maintained in the lowest rank state detection section DTc. Therefore, at time t31, the lowest rank signal output circuit 50 outputs the detection signal DT2 (abnormal signal AB1 with duty cycle T1) issued by the intermediate rank signal output circuit 50 as the detection signal DT3.

In this manner, an abnormal signal AB1 with duty cycle T1 is sequentially transmitted from the highest rank signal output circuit 50, to the intermediate rank signal output circuit 50, to the lowest rank signal output circuit 50, and input to the battery ECU 510. Based on the duty cycle T1 of the abnormal signal, the battery ECU 510 can rapidly determine that a terminal voltage abnormality has developed in a battery cell 10 in battery module 100*a*.

FIG. 10C shows selection signals SE1-3 and detection signals DT1-3 when the terminal voltage of a battery cell 10 in battery module 100*b* goes outside the allowable limits at time t32. In this case, a LOW level selection signal SE1 is maintained in the highest rank state detection section DTa. Therefore, the highest rank signal output circuit 50 outputs a normal signal NM1 with duty cycle T0 as the detection signal DT1. The selection signal SE2 in the intermediate rank state detection section DTb rises from a LOW level to a HIGH level at time t32. Therefore, at time t32, the intermediate rank signal output circuit 50 outputs an abnormal signal AB2 with duty cycle T2 as the detection signal DT2. A LOW level selection signal SE3 is maintained in the lowest rank state detection section DTc. Therefore, at time t32, the lowest rank signal output circuit 50 outputs the detection signal DT2 (abnormal signal AB2 with duty cycle T2) issued by the intermediate rank signal output circuit 50 as the detection signal DT3.

In this manner, even when the detection signal DT1 output from the highest rank signal output circuit 50 is a normal signal NM1, an abnormal signal AB2 with duty cycle T2 output from the intermediate rank signal output circuit 50 is sequentially transmitted to the lowest rank signal output circuit 50 and input to the battery ECU 510. Based on the duty cycle T2 of the abnormal signal, the battery ECU 510 can rapidly determine that a terminal voltage abnormality has developed at least in a battery cell 10 in battery module 100*b*.

FIG. 10D shows selection signals SE1-3 and detection signals DT1-3 when the terminal voltage of a battery cell 10 in battery module 100c goes outside the allowable limits at time t33. In this case, a LOW level selection signal SE1 is maintained in the highest rank state detection section DTa. Therefore, the highest rank signal output circuit 50 outputs a normal signal NM1 with duty cycle T0 as the detection signal DT1. A LOW level selection signal SE2 is maintained in the intermediate rank state detection section DTb. Therefore, the intermediate rank signal output circuit 50 outputs the detection signal DT1 (normal signal NM1 with duty cycle T0) issued by the highest rank signal output circuit 50 as the detection signal DT2. The selection signal SE3 rises from a LOW level to a HIGH level at time t33 in the lowest rank state detection section DTc. Therefore, at time t33, the lowest rank signal output circuit 50 outputs an abnormal signal AB3 with duty cycle T3 as the detection signal DT3.

In this manner, even when the detection signal DT1 output from the highest rank signal output circuit 50 and the detection signal DT2 output from the intermediate rank signal output circuit 50 are the normal signal NM1, an abnormal signal AB3 with duty cycle T3 output from the lowest rank signal output circuit 50 is input to the battery ECU 510. Based on the duty cycle T3 of the abnormal signal, the battery ECU 510 can rapidly determine that a terminal voltage abnormality has developed at least in a battery cell 10 in battery module 100c.

[3] Third Embodiment

Figure 11:
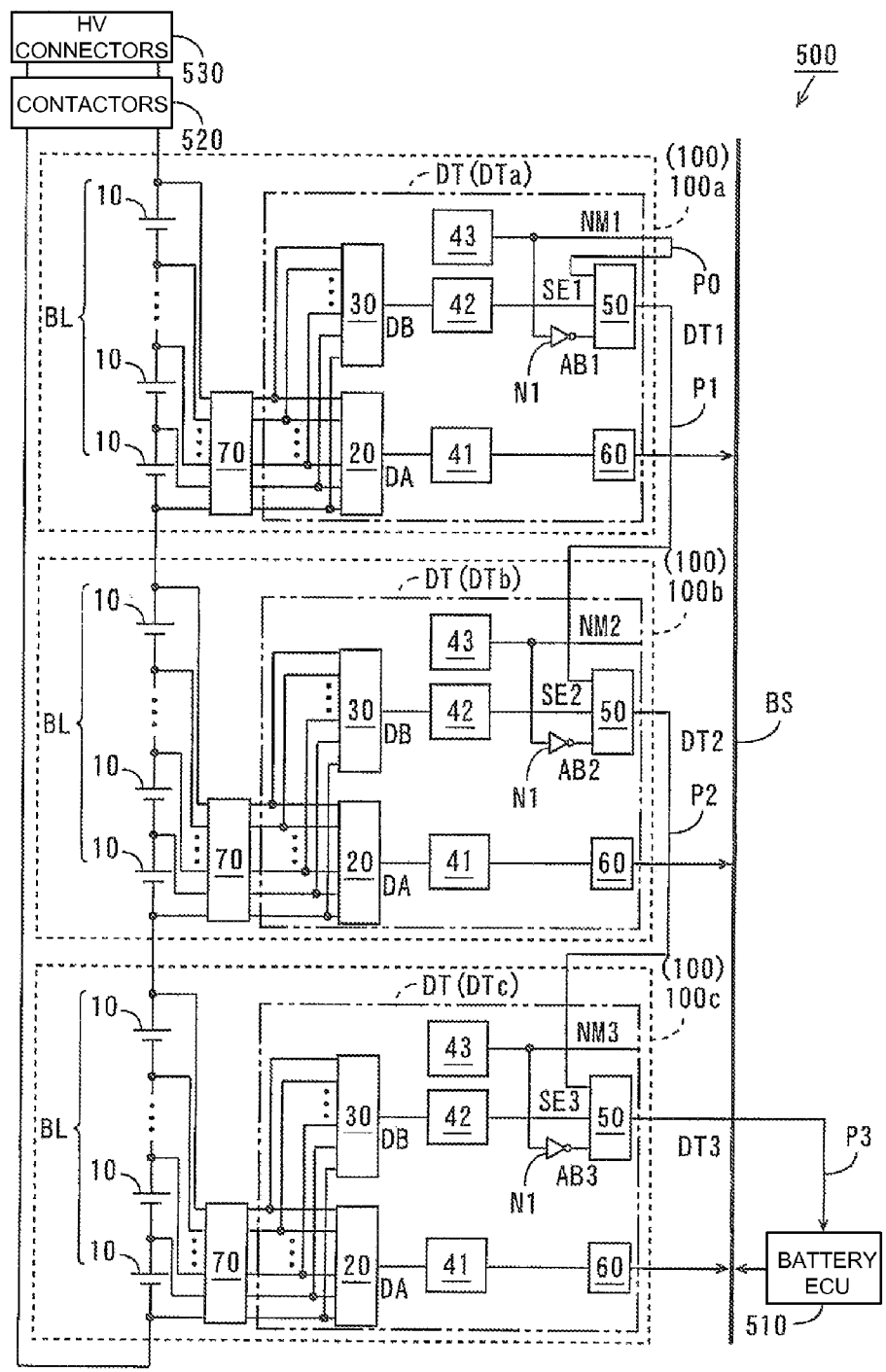
FIG. 11 is a block diagram showing the structure of a battery system for the third embodiment.

The differences between the battery system 500 for the third embodiment and the battery system 500 for the first embodiment are described below. FIG. 11 is a block diagram showing the structure of a battery system 500 for the third embodiment. As shown in FIG. 11, each state detection section DT for this embodiment has a communication circuit 41, a selection signal generating section 42, and a signal generating section 43 instead of a processing device 40.

The communication circuit 41 (of each state detection section DT) communicates via the communication driver 60 using a protocol such as Controller Area Network (CAN). Accordingly, the communication circuit 41 sends terminal voltage values for the (plurality of) battery cells 10 to the battery ECU 510 over the communication bus BS based on detection signals DA input from the voltage detection section 20. The communication circuits 41 also acquire battery module 100a-c temperature values from thermistors TH (described later in FIG. 13). Further, the communication circuits 41 receive various command signals from the battery ECU 510 via the communication bus BS and communication driver 60.

The signal generating section 43 (of each state detection section DT) generates normal signals. Normal signals generated by the signal generating section 43 are inverted by the NOT circuit N1 to produce abnormal signals. However, the signal generating section 43 can also generate both normal signals and abnormal signals, and in that case, the NOT circuit N1 does not need to be provided.

Figure 12:
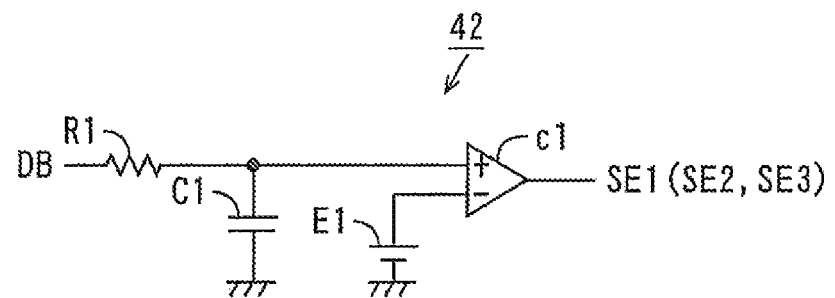
FIG. 12 is a block diagram showing the structure of the selection signal generating section.

The selection signal generating section 42 (of detection section DT1 for example) generates a selection signal SE1 to select either a normal signal NM1 or and abnormal signal AB1 based on the detection signal DB input from the abnormality detection section 30. FIG. 12 is a block diagram showing the structure of the selection signal generating section 42. FIG. 12 shows the structure of the selection signal generating section 42 in battery module 100a. As shown in FIG. 12, the selection signal generating section 42 includes a resistor R1, capacitor C1, comparator c1, and a direct current (DC) voltage source E1. The detection signal DB is input to the non-inverting input of the comparator c1 through the resistor R1. The non-inverting input of the comparator c1 is connected to ground potential through the capacitor C1. The inverting input of the comparator c1 is connected to the DC voltage source E1. The DC voltage source E1 is, for example, 2.5V.

The resistor R1 and capacitor C1 form a low-pass filter. A detection signal DB with the first duty cycle (for example, 75%) is converted to a signal that is a first voltage (for example, 4.5V) by the low-pass filter. A detection signal DB with the second duty cycle (for example, 25%) is converted to a signal that is a second voltage (for example, 0.5V) by the low-pass filter.

When a signal with the first voltage, which is greater than the DC voltage source E1, is input to the non-inverting input of the comparator c1, a HIGH level selection signal SE1 is output from the comparator c1. When a signal with the second voltage, which is less than the DC voltage source E1, is input to the non-inverting input of the comparator c1, a LOW level selection signal SE1 is output from the comparator c1. The structure and operation of the selection signal generating sections 42 of battery modules 100b and 100c are the same as for the selection signal generating section 42 in FIG. 12 except that the selection signals are SE2 and SE3 instead of SE1.

In the present embodiment, processing devices 40 are not provided in the state detection sections DT. Consequently, battery system 500 cost can be reduced.

However, the communication circuit 41, selection signal generating section 42, and signal generating section 43 can also be implemented by a single processing device 40. In that case, state detection section DT size reduction can be achieved, and the structure of the state detection section DT can be simplified.

[4] Battery Module

Figure 13:
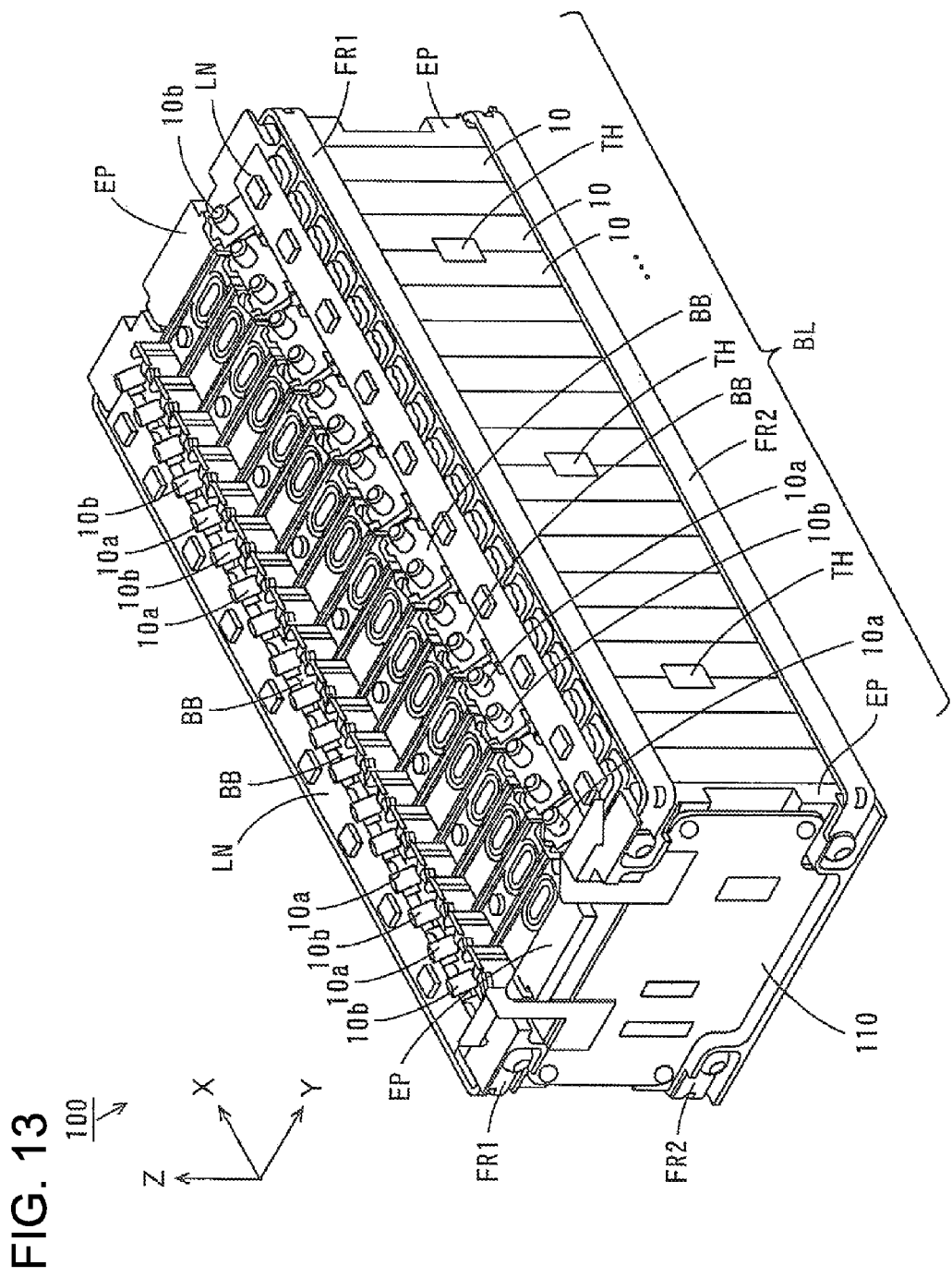
FIG. 13 is an oblique view showing the external appearance of one example of a battery module.

Battery module 100 structure is described below. FIG. 13 is an oblique view showing the external appearance of one example of a battery module 100. In FIG. 13, mutually orthogonal directions X, Y, and Z are defined as shown by the arrows of axes X, Y, and Z. Here, the X and Y direction axes lie in the horizontal plane while the Z direction is perpendicular to the horizontal plane. Further, the upward direction is in the Z direction.

As shown in FIG. 13, a plurality of (approximately) flat rectangular solid shaped battery cells 10 are lined-up (stacked) in the X direction. A pair of roughly flat-plate shaped endplates EP is disposed at the end planes parallel to the Y-Z plane. A pair of upper fastening bands FR1 and a pair of lower fastening bands FR2 are disposed extending in the X direction. Connecting sections are established in the four corners of each endplate EP for connecting the pair of upper fastening bands FR1 and the pair of lower fastening bands FR2. The pair of upper fastening bands FR1 is attached to the upper connecting sections of the pair of endplates EP and the pair of lower fastening bands FR2 is attached to the lower connecting sections of the pair of endplates EP with the (plurality of) battery cells 10 disposed between the pair of endplates EP. This holds the (plurality of) battery cells 10 as a single unit between the pair of endplates EP, the pair of upper fastening bands FR1, and the pair of lower fastening bands FR2. The (plurality of) battery cells 10, the pair of endplates EP, the pair of upper fastening bands FR1, and the pair of lower fastening bands FR2 form a battery block BLK with (approximately) a rectangular solid shape. A battery block BLK includes the group of battery cells BL shown in FIG. 1.

A printed circuit board 110 is attached to one of the endplates EP. A plurality of thermistors TH is installed at the side of the battery block BLK to detect battery module 100 temperature.

Each battery cell 10 has a positive electrode 10a and a negative electrode 10b that line-up in the Y direction along the upper surface of the battery block BLK. For each battery cell 10 in the battery module 100, the positions of the positive electrode 10a and negative electrode 10b in the Y direction are reversed compared to adjacent battery cells 10. Further, electrodes 10a, 10b on one side of the plurality of battery cells 10 line-up in the X direction on one side of the battery block BLK and electrodes 10b, 10a on the other side of the plurality of battery cells 10 line-up in the X direction on the other side.

For two adjacent battery cells 10 in this arrangement, the positive electrode 10a of one battery cell 10 is disposed next to the negative electrode 10b of the adjacent battery cell 10, and at the other end the negative electrode 10b of the battery cell 10 is disposed next to the positive electrode 10a of the adjacent battery cell 10. In this configuration, two adjacently disposed electrodes 10a, 10b are connected by hardware such as copper bus-bars BB. As a result, the (plurality of) battery cells 10 are connected in series.

A flexible printed circuit board LN that extends in a long band in the X direction on one side of the battery cells 10 is connected in common with the bus-bars BB. Similarly, another flexible printed circuit board LN that extends in a long band in the X direction on the other side of the battery cells 10 is connected in common with the bus-bars BB.

The flexible printed circuit boards LN are mainly configured with a plurality of conducting runs W1 (refer to FIG. 2) on insulating layers, and are bendable and resilient. Materials such as polyimide are used to form the insulating layers of the flexible printed circuit boards LN, and conductors such as copper are used as conducting runs W1. Each flexible printed circuit board LN is folded inward at a right angle on top of the endplate EP at one end of the group of battery cells BL, folded again downward, and connected to the printed circuit board 110. This connects the voltage detection section 20, abnormality detection section 30, and equalizing circuit 70 of FIG. 1 with the positive and negative electrodes 10a, 10b of each battery cell 10.

[5] Electric-Powered Vehicle

An electric-powered vehicle is described below. The electric-powered vehicle is equipped with a battery system 500 of an embodiment described above. In the following, an electric automobile is described as one example of an electric-powered vehicle.

Figure 14:
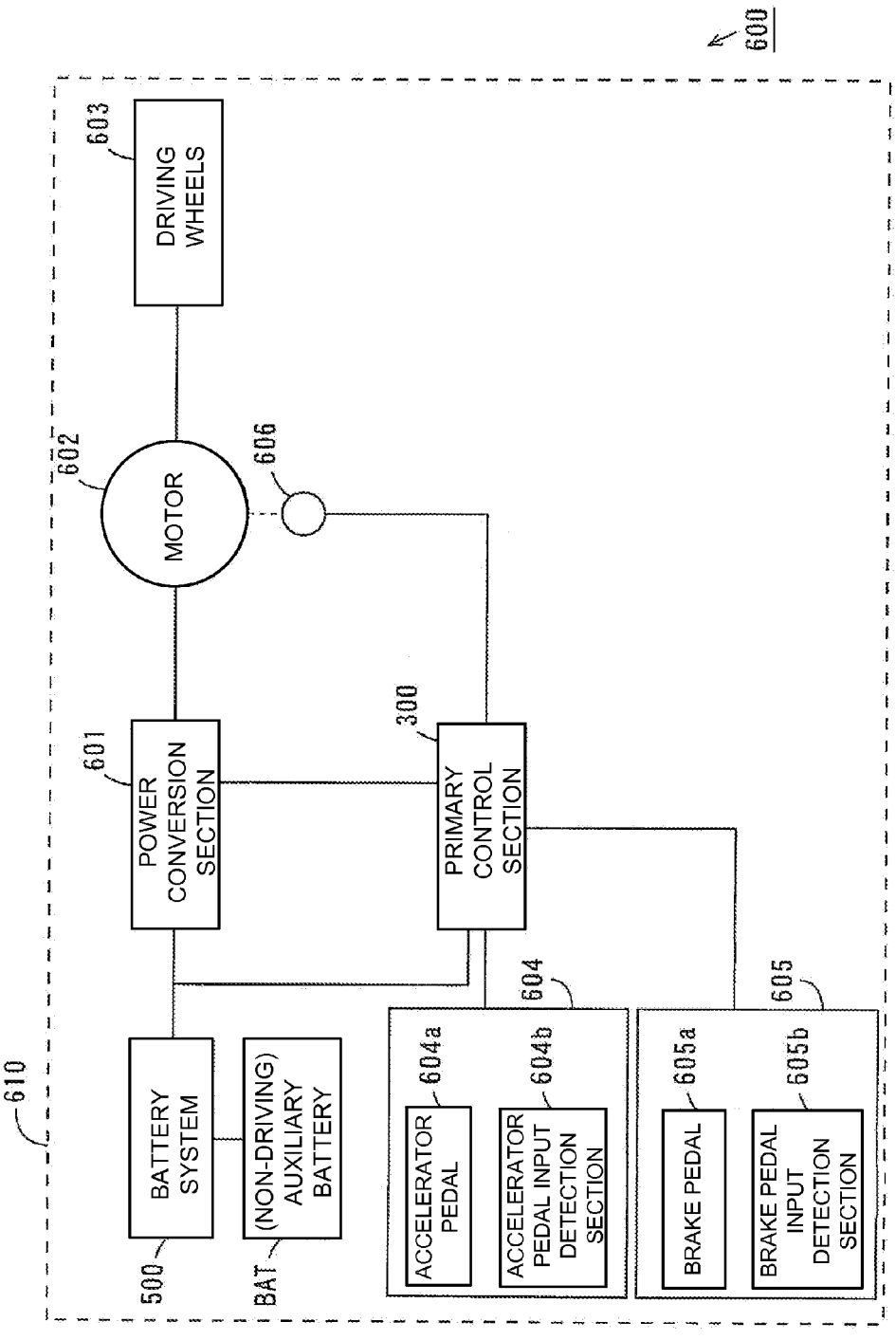
FIG. 14 is a block diagram showing the structure of a battery system equipped electric automobile.

FIG. 14 is a block diagram showing the structure of an electric automobile equipped with a battery system 500. As shown in FIG. 14, the electric automobile 600 is provided with a vehicle chassis 610. The vehicle chassis 610 is provided with the battery system 500 and auxiliary battery BAT of FIG. 1, a power conversion section 601, a motor 602, driving wheel(s) 603, an accelerating device (accelerator) 604, a braking device 605, a rotation speed sensor (tachometer) 606, and a primary control section 300. For the case where the motor 602 is an alternating current (AC) motor, the power conversion section 601 includes direct current-alternating current (DC/AC) inverter circuitry. The battery ECU 510 of FIG. 1 is included in the battery system 500.

The battery system 500 is connected to the motor 602 through the power conversion section 601 and is also connected to the primary control section 300.

The charge capacity of the battery modules 100 (refer to FIG. 1) is input to the primary control section 300 from the battery ECU 510 in the battery system 500. In addition, the accelerating device 604, the braking device 605, and the tachometer 606 are connected to the primary control section 300. The primary control section 300 is implemented by a device such as a CPU and memory, or a microcomputer (or microcontroller).

The accelerating device 604 includes an accelerator pedal 604a installed in the electric automobile 600, and an accelerator pedal input detection section 604b to detect the amount of accelerator pedal input (the amount that the accelerator pedal is pressed). When an operator operates the accelerator pedal 604a, the accelerator pedal input detection section 604b detects the amount of accelerator pedal application compared to a reference state with no operator input. The detected amount of accelerator pedal 604a input is sent to the primary control section 300.

The braking device 605 includes a brake pedal 605a installed in the electric automobile 600, and a brake pedal input detection section 605b to detect the amount of brake pedal input (the amount that the brake pedal is pressed). When an operator operates the brake pedal 605a, the brake pedal input detection section 605b detects the amount of brake pedal application. The detected amount of brake pedal 605a input is sent to the primary control section 300. The tachometer 606 detects rotation speed of the motor 602. The detected rotation speed is input to the primary control section 300.

As described above, the charge capacity of the battery modules 100, the amount of accelerator pedal 604a application, the amount of brake pedal 605a application, and the motor 602 rotation speed is input to the primary control section 300. Based on that data, the primary control section 300 controls battery module 100 charging and discharging, and controls power conversion by the power conversion section 601. For example, when the accelerator pedal is operated during electric automobile 600 initial departure and acceleration, power from the battery system 500 battery modules 100 is supplied to the power conversion section 601.

In addition, the primary control section 300 computes the amount of torque that needs to be delivered (torque demand) to the driving wheel(s) 603 based on the amount of accelerator pedal 604a application, and issues a command signal to the power conversion section 601 based on the torque demand.

When the power conversion section 601 receives the command signal described above, it converts power supplied from the battery system 500 to (driving) power required to rotate the driving wheel(s) 603. As a result, driving power converted by the power conversion section 601 is supplied to the motor 602, and the motor 602 torque developed with that driving power is delivered to the driving wheel(s) 603.

In contrast, when the electric automobile 600 is decelerated by brake pedal application, the motor 602 serves as an electricity generating device (generator). In that case, the power conversion section 601 converts (regenerative braking) power generated by the motor 602 to power suitable for charging the (plurality of) battery cells 10, and delivers that power to the battery cells 10. As a result, the (plurality of) battery cells 10 are charged.

(2) Effectiveness

The electric automobile 600 is equipped with the battery system 500 of an embodiment described previously. Therefore, when an abnormality develops in a battery cell 10 of a battery module 100, the primary control section 300 can rapidly and reliably detect that abnormality via the battery ECU 510.

Further, abnormal signals AB1-3 generated in the state detection sections DTa-c can be transmitted to the primary control section 300 through the battery ECU 510 without making the communication circuitry complex.

Note that the primary control section 300 can also perform battery ECU 510 functions. In that case, the primary control section 300 is connected with the communication drivers 60 (refer to FIG. 1) in each battery module 100a-c included in each battery system 500. The primary control section 300 is also connected with the signal output circuits 50 (refer to FIG. 1) in each battery module 100a-c included in each battery system 500. When the primary control section 300 incorporates battery ECU 510 functionality, battery ECUs 510 do not need to be provided in each battery system 500.

(3) Other Movable Equipment

Although an example of installation of the battery system 500 in FIG. 1 in an electric-powered vehicle is described above, the battery system 500 can also be installed in movable equipment such as a boat, aircraft, elevator, or walking robot.

In a boat equipped with the battery system 500, a (boat) hull is provided, for example, instead of the vehicle chassis 610 in FIG. 14. A (boat) propeller is provided instead of driving wheel(s) 603, an acceleration input section is provided instead of an accelerating device 604, and a deceleration input section is provided instead of a braking device 605. The operator uses the acceleration input section instead of the accelerating device 604 to accelerate the boat, and uses the deceleration input section instead of the braking device 605 to decelerate the boat. In this case, the hull is the main unit of the movable equipment, an electric motor is the mechanical power source, and the (boat) propeller is the driving section. In this equipment configuration, the motor receives electrical power from the battery system 500, electrical power is converted to mechanical power, and the (boat) propeller is rotated by mechanical power to move the (boat) hull.

Similarly, in an aircraft equipped with the battery system 500, an airframe (fuselage, wings, and empennage) is provided, for example, instead of the vehicle chassis 610 in FIG. 14. An (aircraft) propeller is provided instead of driving wheel(s) 603, an acceleration input section is provided instead of an accelerating device 604, and a deceleration input section is provided instead of a braking device 605. In this case, the airframe is the main unit of the movable equipment, a motor is the mechanical power source, and the (aircraft) propeller is the driving section. In this equipment configuration, the motor receives electrical power from the battery system 500, electrical power is converted to mechanical power, and the (aircraft) propeller is rotated by mechanical power to move the airframe.

In an elevator equipped with the battery system 500, an (elevator) car (cab, cage, carriage) is provided, for example, instead of the vehicle chassis 610 in FIG. 14. A hoist cable to raise and lower the car is provided instead of driving wheel(s) 603, an acceleration input section is provided instead of an accelerating device 604, and a deceleration input section is provided instead of a braking device 605. In this case, the (elevator) car is the main unit of the movable equipment, a motor is the mechanical power source, and the hoist cable is the driving section. In this equipment configuration, the motor receives electrical power from the battery system 500, electrical power is converted to mechanical power, and the hoist cable is driven by mechanical power to move the (elevator) car.

In a walking robot equipped with the battery system 500, a (robot) body is provided, for example, instead of the vehicle chassis 610 in FIG. 14. Legs are provided instead of driving wheel(s) 603, an acceleration input section is provided instead of an accelerating device 604, and a deceleration input section is provided instead of a braking device 605. In this case, the (robot) body is the main unit of the movable equipment, motors are the mechanical power source, and the legs are the driving section. In this equipment configuration, the motors receive electrical power from the battery system 500, electrical power is converted to mechanical power, and the legs are activated by mechanical power to move the (robot) body.

As described above, the movable equipment carries a battery system 500 on-board. The mechanical power source receives electric power from the battery system 500 and converts it to mechanical power, and the driving section moves the main unit of the movable equipment with mechanical power from the mechanical power source.

[6] Power Source Apparatus (1) Structure and Operation

Figure 15:
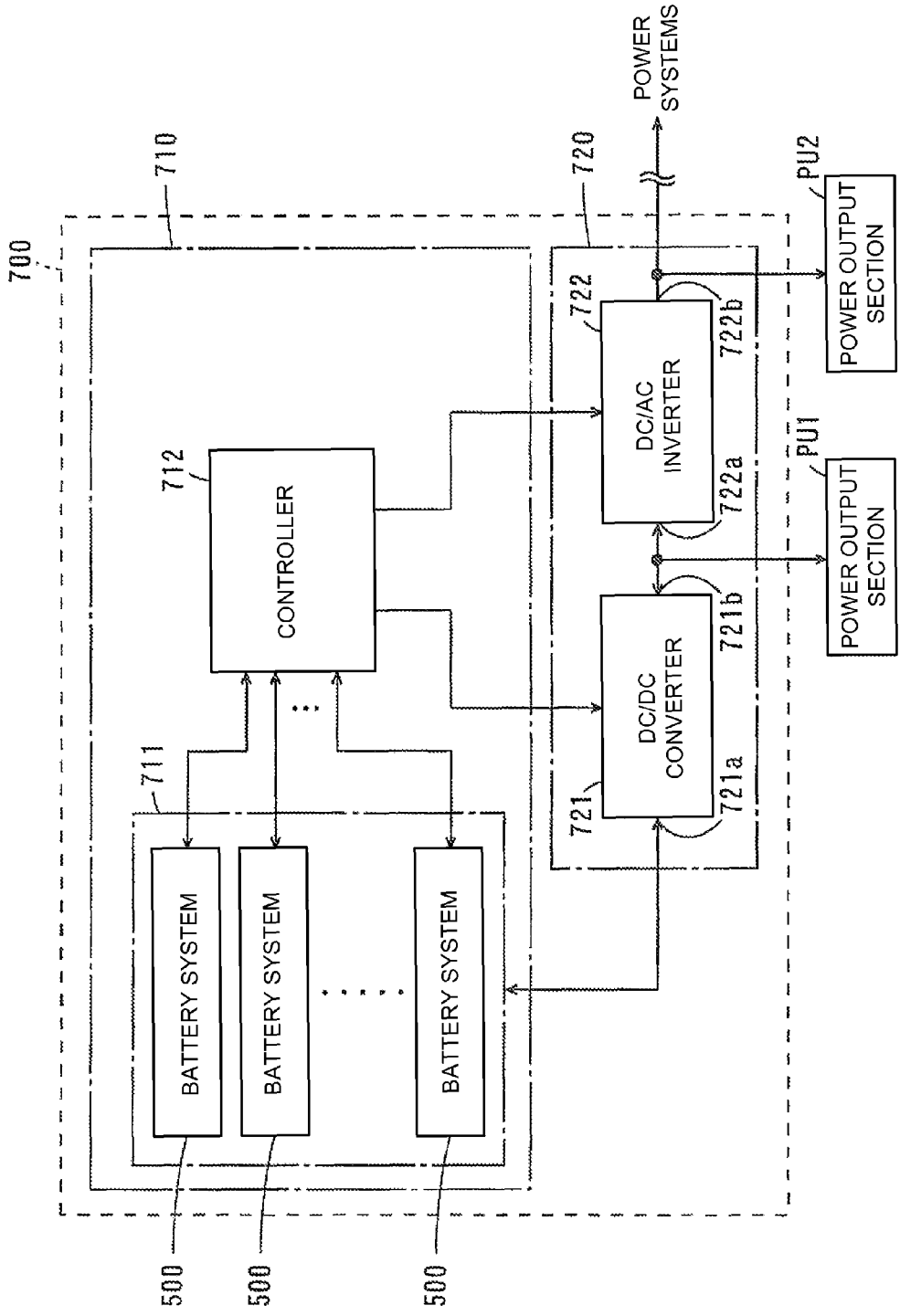
FIG. 15 is a block diagram showing power source apparatus structure.

A power source apparatus is described below. FIG. 15 is a block diagram showing power source apparatus structure. As shown in FIG. 15, the power source apparatus 700 is provided with a power storage device 710 and power conversion device 720. The power storage device 710 is provided with an array of battery systems 711 and a controller 712. The array of battery systems 711 includes a plurality of battery systems 500. The (plurality of) battery systems 500 can be connected in series or parallel.

The controller 712 is implemented by a device such as a CPU and memory, or a microcomputer (or microcontroller). The controller 712 is connected to the battery ECUs 510 (refer to FIG. 1) included in each battery system 500. The controller 712 controls the power conversion device 720 based on the charge capacity of each battery cell 10 input from each battery ECU 510. As described later, the controller 712 performs control operations related to charging and discharging the battery modules 100 in the battery systems 500.

The power conversion device 720 includes a direct current-to-direct current (DC/DC) converter 721 and a DC/AC inverter 722. The DC/DC converter 721 has input-output terminals 721a, 721b, and the DC/AC inverter 722 has input-output terminals 722a, 722b. The DC/DC converter 721 input-output terminal 721a is connected to the array of battery systems 711 in the power storage device 710 via the HV connectors 530 (refer to FIG. 1) of each battery system 500.

The input-output terminal 721b of the DC/DC converter 721 and the input-output terminal 722a of the DC/AC inverter 722 are connected together and to a power output section PU1. The input-output terminal 722b of the DC/AC inverter 722 is connected to power output section PU2 and to other power systems.

The power output sections PU1, PU2 include, for example, power outlets (sockets), and various loads can be connected to the power output sections PU1, PU2. Other connected power systems include systems such as commercial power sources and solar cells. The power output sections PU1, PU2 and power systems are examples of external connections to the power source apparatus. When solar cells are employed as an externally connected power system, the solar cells are connected to the input-output terminal 721b of the DC/DC converter 721. However, when the power system is a solar power generating system that includes solar cells, the solar power generating system power conditioner AC output section is connected to the input-output terminal 722b of the DC/AC inverter 722.

Charging and discharging the array of battery systems 711 is performed by controlling the DC/DC converter 721 and DC/AC inverter 722 via the controller 712. When the array of battery systems 711 is discharged, power from the array of battery systems 711 is converted from DC power (at one voltage and current) to DC power (at another voltage and current) by the DC/DC converter 721 and is also converted from DC power to AC power by the DC/AC inverter 722.

When the power source apparatus 700 is used as a source of DC power, power converted by the DC/DC converter 721 is supplied to power output section PU1. When the power source apparatus 700 is used as a source of AC power, power converted to AC by the DC/AC inverter 722 is supplied to power output section PU2. Power converted to AC by the DC/AC inverter 722 can also be supplied to other power systems.

As one example of discharging battery modules 100 in the array of battery systems 711, the controller 712 performs the following functions. During discharge of the array of battery systems 711, the controller 712 judges whether or not discharging should be suspended or whether or not discharging current (or discharging power) should be limited based on computed charge capacity. The controller 723 controls the power conversion device 720 based that judgment. Specifically, when the charge capacity of any battery cell 10 of the plurality of battery cells 10 in the array of battery systems 711 drops below a preset threshold value, the controller 712 controls the DC/DC converter 721 and the DC/AC inverter 722 to suspend discharging the array of battery systems 711 or limit discharging current (or discharging power). This prevents over-discharging in all the battery cells 10.

To limit discharging current (or discharging power), discharge is limited to attain a constant reference voltage in the array of battery systems 711. The reference voltage is set by the controller 712 based on battery cell 10 charge capacity.

Meanwhile, when the array of battery systems 711 are charged, AC power from another power system is converted to DC by the DC/AC inverter 722 and further converted by the DC/DC converter 721. The (plurality of) battery cells 10 (refer to FIG. 1) in the array of battery systems 711 are charged by power input from the DC/DC converter 721.

As one example of charging battery modules 100 in the array of battery systems 711, the controller 712 performs the following functions. During charging the array of battery systems 711, the controller 712 judges whether or not charging should be suspended or whether or not charging current (or charging power) should be limited based on computed charge capacity. The controller 712 controls the power conversion device 720 based that judgment. Specifically, when the charge capacity of any battery cell 10 of the plurality of battery cells 10 in the array of battery systems 711 rises above a preset threshold value, the controller 712 controls the DC/DC converter 721 and the DC/AC inverter 722 to suspend charging the array of battery systems 711 or limit charging current (or charging power). This prevents over-charging in all the battery cells 10.

To limit charging current (or charging power), charging is limited to attain a constant reference voltage in the array of battery systems 711. The reference voltage is set by the controller 712 based on battery cell 10 charge capacity.

Note that if it is possible to supply power mutually between the power source apparatus 700 and an external system, the power conversion device 720 may be provided with either a DC/DC converter 721 or a DC/AC inverter 722. Further, if it is possible to supply power mutually between the power source apparatus 700 and an external system, provision of the power conversion device 720 may be unnecessary.

(2) Effectiveness

In the power source apparatus 700, the supply of power between the array of battery systems 711 and the outside is controlled by the controller 712. This allows over-charging and over-discharging to be prevented in each battery cell 10 in the array of battery systems 711.

The power source apparatus 700 is equipped with the battery systems 500 for an embodiment described previously. Therefore, when an abnormality develops in a battery cell 10 of a battery module 100, the controller 712 can rapidly and reliably detect that abnormality via the battery ECUs 510.

Further, abnormal signals AB1-3 generated in the state detection sections DTa-c can be transmitted to the controller 712 through the battery ECUs 510 without making the communication circuitry complex.

When the controller 712 detects an abnormality in a group of battery cells BL, it controls the power conversion device 720. Accordingly, the contactors 520 in FIG. 1 do not need to be provided in each battery system 500.

Note that the controller 712 can also perform battery ECU 510 functions. In that case, the controller 712 is connected with the communication drivers 60 (refer to FIG. 1) in each battery module 100a-c included in each battery system 500. The controller 712 is also connected with the signal output circuits 50 (refer to FIG. 1) in each battery module 100a-c included in each battery system 500. When the controller 712 incorporates battery ECU 510 functionality, battery ECUs 510 do not need to be provided in each battery system 500.

[7] Other Embodiments (1) Although battery modules 100 in the embodiments described above have voltage detection sections 20 to detect battery cell 10 terminal voltages and thermistors TH to detect battery module 100 temperature, where the voltages and temperatures are parameters that indicate the state of the battery cells 10 in the battery modules 100, embodiments are not limited to those components and parameters. For example, an embodiment can also have current detection sections to detect current flow in a plurality of battery modules 100 and that current flow can be used as a parameter to indicate the state of the battery cells 10.

(2) Although battery modules 100 in the embodiments described above include a plurality of battery cells 10, embodiments are not limited to that configuration and a battery module 100 may also include one battery cell 10.

(3) Although the state detection sections DT in the embodiments described above include voltage detection sections 20, embodiments are not limited to that configuration. In the case of a high reliability battery system 500, the state detection sections DT may not include voltage detection sections 20. Further, the processing devices 40 may not include communication functions. Even in that case, battery cell 10 terminal voltage abnormalities can be detected by the abnormality detection sections 30 in the state detection sections DT.

(4) Although battery systems 500 in the embodiments described above include three battery modules 100a-c, embodiments are not limited to that configuration. A battery system 500 can also include two battery modules 100, or four or more battery modules 100.

(5) Although each battery module 100 in the embodiments described above includes one voltage detection section 20, embodiments are not limited to that configuration. If there is a large number of battery cells 10 in the group of battery cells BL included in the battery module 100, or if the voltage that the voltage detection section 20 can withstand (voltage rating) is low, each battery module 100 can also include a plurality of voltage detection sections 20. In that case, each voltage detection section 20 detects the terminal voltage of each associated battery cell 10 among the plurality of battery cells 10 included in the group of battery cells BL.

(6) Although each battery module 100 in the embodiments described above includes one abnormality detection section 30, embodiments are not limited to that configuration. If there is a large number of battery cells 10 in the group of battery cells BL included in the battery module 100, or if the voltage that the abnormality detection section 30 can withstand (voltage rating) is low, each battery module 100 can also include a plurality of abnormality detection sections 30. In that case, each abnormality detection section 30 detects abnormalities in each associated battery cell 10 among the plurality of battery cells 10 included in the group of battery cells BL.

[8] Relation Between Structural Elements in the Claims and Components of the Embodiments Although the following describes examples of associations between components of the embodiments and structural elements in the claims, the present invention is not limited to the examples below.

The battery module 100 is an example of a battery module, the battery cell 10 is an example of a battery cell, and the group of battery cells BL is an example of a group of battery cells. The state detection section DT is an example of a state detection section, the abnormality detection section 30 is an example of an abnormality detection section, the processing device 40 and the signal generating section 43 are examples of an abnormal signal generating section, the signal output circuit 50 is an example of a signal output circuit, and the battery system 500 is an example of a battery system. The voltage detection section 20 and thermistors TH are examples of parameter detection sections, the processing device 40 and the communication circuit 41 are examples of a communication circuit, the processing device 40 and the selection signal generating section 42 are examples of a selection signal generating section, the processing device 40 is an example of a processing device, and the (non-driving) auxiliary battery BAT is an example of a power supply.

The motor 602 is an example of a motor, the driving wheel(s) 603 are examples of driving wheel(s), the electric automobile 600 is an example of an electric-powered vehicle, and the vehicle chassis 610, boat hull, aircraft airframe, elevator car, and robot body are examples of the main unit of movable equipment. The motor 602, driving wheel(s) 603, boat propeller, aircraft propeller, hoist cable motor, and robot legs are examples of a mechanical power source, and the electric automobile 600, boat, aircraft, elevator, and walking robot are examples of movable equipment. The controller 712 is an example of a system control section, the power storage device 710 is an example of a power storage device, the power source apparatus 700 is an example of a power source apparatus, and the power conversion device 720 is an example of a power conversion device.

Note that it is also possible to use various other elements having the structure or functions cited in the claims to implement each of the structural elements in the claims.

The invention claimed is:

1. A battery system comprising a plurality of battery modules,
each battery module including:
a group of battery cells including one or a plurality of battery cells; and
a state detection section provided to detect the state of the corresponding group of battery cells,
each state detection section including:
an abnormality detection section to detect abnormalities in the corresponding group of battery cells;
an abnormal signal generating section to issue abnormal signals indicating an abnormality in the corresponding group of battery cells; and
a signal output circuit that can output abnormal signals issued by the abnormal signal generating section,
wherein the plurality of battery module state detection sections are configured with a signal transmission ranking from highest to lowest rank,
the signal output circuit of the highest rank state detection section outputs the abnormal signal issued from the corresponding abnormal signal generating section when an abnormality is detected by the corresponding abnormality detection section,
the signal output circuit of each state detection section other than the highest rank state detection section outputs the abnormal signal issued from the corresponding abnormal signal generating section when an abnormality is detected by the corresponding abnormality detection section, and outputs the abnormal signal issued from a higher rank state detection section when no abnormal condition is detected by the corresponding abnormality detection section, and
each abnormal signal generating section of the plurality of state detection sections generates a pulse signal with a different duty cycle as its respective abnormal signal.

2. The battery system as recited in claim 1, wherein parameter detection sections are included to detect parameters indicating the state of one or a plurality of battery cells in the corresponding group of battery cells, and a communication circuit is included to transmit parameters detected by the parameter detection sections to other components within or external from the battery system.

3. The battery system as recited in claim 1, wherein the abnormal signal generating section and communication circuit of each state detection section are implemented by an arithmetic processing device.

4. The battery system as recited in claim 1, wherein the abnormal signal generating section, selection signal generating section, and communication circuit of each state detection section are implemented by an arithmetic processing device.

5. The battery system as recited in claim 1, wherein the abnormality detection section of each state detection section operates on power from the corresponding group of battery cells, while the abnormal signal generating section and signal output circuit of each state detection section operates on power from a power supply other than one or a plurality of the corresponding battery cells.

6. An electric-powered vehicle comprising:
the battery system as recited in claim 1;
a motor driven by battery system power; and
at least one driving wheel rotated by torque from the motor.

7. Movable equipment comprising:
the battery system as recited in claim 1;
a main unit of the movable equipment; and
a mechanical power source to convert electric power from the battery system to mechanical power to move the main unit of the movable equipment.

8. A power source apparatus that connects to other components within or external from a battery system comprising:
a power storage device recited in claim 7; and
a power conversion device that is controlled by the power storage device system control section to perform power conversion between the power storage device battery systems and the other components within or external from the battery system.

9. A power storage device comprising:
battery systems as recited in claim 1; and
a system control section that performs control related to charging and discharging the plurality of battery modules in the battery systems.

10. A battery system comprising a plurality of battery modules,
each battery module including:
a group of battery cells including one or a plurality of battery cells; and
a state detection section provided to detect the state of the corresponding group of battery cells,
each state detection section including:
an abnormality detection section to detect abnormalities in the corresponding group of battery cells;
an abnormal signal generating section to issue abnormal signals indicating an abnormality in the corresponding group of battery cells; and
a signal output circuit that can output abnormal signals issued by the abnormal signal generating section,
wherein the plurality of battery module state detection sections are configured with a signal transmission ranking from highest to lowest rank,
the signal output circuit of the highest rank state detection section outputs the abnormal signal issued from the corresponding abnormal signal generating section when an abnormality is detected by the corresponding abnormality detection section,
the signal output circuit of each state detection section other than the highest rank state detection section outputs the abnormal signal issued from the corresponding abnormal signal generating section when an abnormality is detected by the corresponding abnormality detection section, and outputs the abnormal signal issued from a higher rank state detection section when no abnormal condition is detected by the corresponding abnormality detection section, and
the abnormality detection section of each state detection section operates on power from the corresponding group of battery cells, while the abnormal signal generating section and signal output circuit of each state detection section operates on power from a power supply other than one or a plurality of the corresponding battery cells.

11. The battery system as recited in claim 10, wherein parameter detection sections are included to detect parameters indicating the state of one or a plurality of battery cells in the corresponding group of battery cells, and a communication circuit is included to transmit parameters detected by the parameter detection sections to other components within or external from the battery system.

12. The battery system as recited in claim 10, wherein the abnormal signal generating section and communication circuit of each state detection section are implemented by an arithmetic processing device.

13. The battery system as recited in claim 10, wherein the abnormal signal generating section, selection signal generating section, and communication circuit of each state detection section are implemented by an arithmetic processing device.

14. An electric-powered vehicle comprising:
the battery system as recited in claim 10;
a motor driven by battery system power; and
at least one driving wheel rotated by torque from the motor.

15. Movable equipment comprising:
the battery system as recited in claim 10;
a main unit of the movable equipment; and
a mechanical power source to convert electric power from the battery system to mechanical power to move the main unit of the movable equipment.

16. A power source apparatus that connects to other components within or external from a battery system comprising:
a power storage device as recited in claim 10; and
a power conversion device that is controlled by the power storage device system control section to perform power conversion between the power storage device battery systems and the other components within or external from the battery system.

17. A power storage device comprising:
battery systems as recited in claim 10; and
a system control section that performs control related to charging and discharging the plurality of battery modules in the battery systems.

* * * * *